US010755901B2

(12) United States Patent
Chambers et al.

(10) Patent No.: US 10,755,901 B2
(45) Date of Patent: Aug. 25, 2020

(54) PLASMA SOURCE UTILIZING A MACRO-PARTICLE REDUCTION COATING AND METHOD OF USING A PLASMA SOURCE UTILIZING A MACRO-PARTICLE REDUCTION COATING FOR DEPOSITION OF THIN FILM COATINGS AND MODIFICATION OF SURFACES

(71) Applicants: AGC FLAT GLASS NORTH AMERICA, INC., Alpharetta, GA (US); AGC Glass Europe, Louvain-la-Neuve (BE); ASAHI GLASS CO., LTD., Tokyo (JP)

(72) Inventors: John Chambers, San Francisco, CA (US); Peter Maschwitz, Sebastopol, CA (US); Yuping Lin, Alpharetta, GA (US); Herb Johnson, Kingsport, TN (US)

(73) Assignees: AGC FLAT GLASS NORTH AMERICA, INC., Alpharetta, GA (US); AGC GLASS EUROPE, Louvain-la Neuve (BE); ASAHI GLASS CO., LTD., Tokyo (JP)

( * ) Notice: Subject to any disclaimer, the term of this patent is extended or adjusted under 35 U.S.C. 154(b) by 0 days.

(21) Appl. No.: 15/532,845

(22) PCT Filed: Dec. 5, 2014

(86) PCT No.: PCT/US2014/068919
§ 371 (c)(1),
(2) Date: Jun. 2, 2017

(87) PCT Pub. No.: WO2016/089427
PCT Pub. Date: Jun. 9, 2016

(65) Prior Publication Data
US 2017/0338083 A1    Nov. 23, 2017

(51) Int. Cl.
*C23C 16/00*    (2006.01)
*H01L 21/00*    (2006.01)
(Continued)

(52) U.S. Cl.
CPC ........ *H01J 37/32559* (2013.01); *C23C 16/50* (2013.01); *H01J 37/32596* (2013.01); *H05H 1/48* (2013.01); *H01J 2237/3321* (2013.01)

(58) Field of Classification Search
CPC ................................................ H01J 37/32596
See application file for complete search history.

(56) References Cited

U.S. PATENT DOCUMENTS 2,920,235 A    1/1960    Bell et al.
3,253,180 A    5/1966    Huber
(Continued)

FOREIGN PATENT DOCUMENTS

CN    1831190 A    9/2006
CN    1860587 A    11/2006
(Continued)

OTHER PUBLICATIONS

Garcia-Cespedes, et al., "Carbon nanotubes grown by asymmetric bipolar pulsed-DC PECVD", Diamond and Related Materials, vol. 16, pp. 1131-1135, Jan. 25, 2007.
(Continued)

*Primary Examiner* — Sylvia MacArthur
*Assistant Examiner* — Michelle Crowell
(74) *Attorney, Agent, or Firm* — Rothwell, Figg, Ernst & Manbeck, P.C.

(57) ABSTRACT

The present invention relates generally to a plasma source utilizing a macro-particle reduction coating and method of using a plasma source utilizing a macro-particle reduction for deposition of thin film coatings and modification of surfaces. More particularly, the present invention relates to
(Continued)

a plasma source comprising one or more plasma-generating electrodes, wherein a macro-particle reduction coating is deposited on at least a portion of the plasma-generating surfaces of the one or more electrodes to shield the plasma-generating surfaces of the electrodes from erosion by the produced plasma and to resist the formation of particulate matter, thus enhancing the performance and extending the service life of the plasma source.

50 Claims, 10 Drawing Sheets

(51) Int. Cl.
*H01J 37/32* (2006.01)
*H05H 1/48* (2006.01)
*C23C 16/50* (2006.01)

(56) References Cited

U.S. PATENT DOCUMENTS

| | | | |
|---|---|---|---|
| 3,381,157 A | 4/1968 | Ferreira | |
| 3,813,549 A | 5/1974 | Di Stefano et al. | |
| 4,017,808 A | 4/1977 | Fein et al. | |
| 4,196,233 A * | 4/1980 | Bitzer | C23C 16/32 427/249.1 |
| 4,419,203 A | 12/1983 | Harper et al. | |
| 4,422,014 A | 12/1983 | Glaser | |
| 4,702,784 A * | 10/1987 | Naoumidis | C25B 11/12 156/335 |
| 4,916,356 A | 4/1990 | Ahern et al. | |
| 5,028,791 A | 7/1991 | Koshiishi et al. | |
| 5,070,811 A | 12/1991 | Feuerstein et al. | |
| 5,113,790 A | 5/1992 | Geisler et al. | |
| 5,185,132 A | 2/1993 | Horiike et al. | |
| 5,286,534 A | 2/1994 | Kohler et al. | |
| 5,302,422 A * | 4/1994 | Nowak | C23C 16/0245 427/248.1 |
| 5,369,337 A | 11/1994 | Yanagi et al. | |
| 5,399,254 A | 3/1995 | Geisler et al. | |
| 5,437,778 A | 8/1995 | Hedgcoth | |
| 5,581,155 A | 12/1996 | Morozov et al. | |
| 5,593,539 A | 1/1997 | Kubota et al. | |
| 5,609,690 A | 3/1997 | Watanabe et al. | |
| 5,614,248 A | 3/1997 | Schiller et al. | |
| 5,614,273 A | 3/1997 | Goedicke et al. | |
| 5,627,435 A | 5/1997 | Jansen et al. | |
| 5,846,608 A | 12/1998 | Neumann et al. | |
| 5,874,807 A | 2/1999 | Neger et al. | |
| 5,908,602 A | 6/1999 | Bardoes et al. | |
| 5,939,829 A | 8/1999 | Schoenbach et al. | |
| 5,985,378 A | 11/1999 | Paquet | |
| 6,082,293 A | 7/2000 | Kawashima | |
| 6,140,773 A | 10/2000 | Anders et al. | |
| 6,146,462 A | 11/2000 | Yializis et al. | |
| 6,174,450 B1 | 1/2001 | Patrick et al. | |
| 6,177,148 B1 | 1/2001 | Walther et al. | |
| 6,293,222 B1 | 6/2001 | Paquet | |
| 6,388,381 B2 | 5/2002 | Anders | |
| 6,444,945 B1 | 9/2002 | Maschwitz et al. | |
| 6,489,854 B1 | 12/2002 | Chen | |
| 6,508,911 B1 * | 1/2003 | Han | C23C 16/27 118/723 I |
| 6,528,947 B1 | 3/2003 | Chen et al. | |
| 6,750,600 B2 | 6/2004 | Kaufman et al. | |
| 6,768,079 B2 | 7/2004 | Kosakai | |
| 6,800,336 B1 | 10/2004 | Fornsel et al. | |
| 6,849,854 B2 | 2/2005 | Sainty | |
| 6,899,054 B1 | 5/2005 | Bardos et al. | |
| 6,902,814 B2 | 6/2005 | Takahashi et al. | |
| 6,924,223 B2 | 8/2005 | Yamasaki et al. | |
| 7,241,360 B2 | 7/2007 | Shabalin et al. | |
| 7,307,383 B2 | 12/2007 | Takeuchi et al. | |
| 7,322,313 B2 | 1/2008 | Mayumi et al. | |
| 7,327,089 B2 | 2/2008 | Madocks | |
| 7,411,352 B2 | 8/2008 | Madocks | |
| 7,411,353 B1 | 8/2008 | Rutberg et al. | |
| 7,543,546 B2 | 6/2009 | Shibata et al. | |
| 7,649,316 B2 | 1/2010 | Rueger et al. | |
| 7,976,907 B2 | 7/2011 | Hofrichter et al. | |
| 8,143,788 B2 | 3/2012 | Hofer et al. | |
| 8,328,982 B1 | 12/2012 | Babayan et al. | |
| 8,356,575 B2 | 1/2013 | Sasaki et al. | |
| 8,476,587 B2 | 7/2013 | Jones et al. | |
| 8,652,586 B2 | 2/2014 | Maschwitz | |
| 8,697,197 B2 * | 4/2014 | Savas | C23C 16/24 427/569 |
| 8,926,920 B2 | 1/2015 | Morfill et al. | |
| 9,533,914 B2 | 1/2017 | Mahieu et al. | |
| 9,704,692 B2 | 7/2017 | Lesser | |
| 9,721,765 B2 | 8/2017 | Chambers et al. | |
| 9,735,020 B2 | 8/2017 | Hudson | |
| 10,068,743 B2 | 9/2018 | Goerbing | |
| 2002/0000779 A1 | 1/2002 | Anders | |
| 2002/0194833 A1 | 12/2002 | Gallimore et al. | |
| 2003/0113479 A1 * | 6/2003 | Fukuda | H01J 37/32009 427/569 |
| 2004/0033385 A1 | 2/2004 | Kaushal et al. | |
| 2005/0016456 A1 | 1/2005 | Taguchi et al. | |
| 2005/0016458 A1 | 1/2005 | Zhang et al. | |
| 2005/0035731 A1 | 2/2005 | Secheresse et al. | |
| 2005/0040037 A1 | 2/2005 | Walton et al. | |
| 2005/0106094 A1 * | 5/2005 | Kondo | B82Y 10/00 423/447.1 |
| 2005/0115933 A1 | 6/2005 | Kong et al. | |
| 2005/0208215 A1 | 9/2005 | Eguchi et al. | |
| 2005/0221022 A1 | 10/2005 | Wang et al. | |
| 2006/0030134 A1 | 2/2006 | Kim et al. | |
| 2006/0177599 A1 | 8/2006 | Madocks | |
| 2006/0208649 A1 | 9/2006 | Rueger et al. | |
| 2007/0002515 A1 | 1/2007 | Hino et al. | |
| 2007/0017636 A1 | 1/2007 | Goto et al. | |
| 2007/0123041 A1 | 5/2007 | Anzai et al. | |
| 2007/0144621 A1 * | 6/2007 | Farmer | C22C 45/00 148/403 |
| 2007/0163440 A1 | 7/2007 | Kim et al. | |
| 2008/0073557 A1 | 3/2008 | German et al. | |
| 2008/0106202 A1 | 5/2008 | Du et al. | |
| 2009/0004836 A1 | 1/2009 | Singh et al. | |
| 2009/0032393 A1 | 2/2009 | Madocks | |
| 2009/0071403 A1 | 3/2009 | Choi et al. | |
| 2009/0071406 A1 | 3/2009 | Choi et al. | |
| 2009/0183771 A1 | 7/2009 | Sannomiya et al. | |
| 2009/0218212 A1 | 9/2009 | Denpoh et al. | |
| 2010/0028238 A1 * | 2/2010 | Maschwitz | C23C 16/402 423/335 |
| 2010/0044579 A1 | 2/2010 | Holmes et al. | |
| 2010/0126779 A1 * | 5/2010 | Corbett | B22F 7/06 175/432 |
| 2010/0186671 A1 | 7/2010 | Hein et al. | |
| 2010/0225234 A1 | 9/2010 | Tseng et al. | |
| 2011/0005682 A1 | 1/2011 | Savas et al. | |
| 2011/0006040 A1 | 1/2011 | Savas et al. | |
| 2011/0135843 A1 | 6/2011 | Niira et al. | |
| 2011/0192348 A1 | 8/2011 | Tseng et al. | |
| 2011/0212624 A1 | 9/2011 | Hudson | |
| 2011/0226611 A1 * | 9/2011 | Madocks | H01J 27/143 204/192.11 |
| 2011/0297532 A1 | 12/2011 | Chakraborty et al. | |
| 2012/0019946 A1 | 1/2012 | Aravind | |
| 2012/0164353 A1 | 6/2012 | Madocks | |
| 2012/0225218 A1 | 9/2012 | Savas et al. | |
| 2012/0258555 A1 | 10/2012 | Holland et al. | |
| 2012/0289054 A1 | 11/2012 | Holland et al. | |
| 2012/0313517 A1 | 12/2012 | Rueger et al. | |
| 2013/0112670 A1 * | 5/2013 | Yokogawa | H01J 37/32091 219/121.36 |
| 2013/0333618 A1 * | 12/2013 | Cox | C23C 16/52 118/723 FI |
| 2013/0337657 A1 | 12/2013 | Savas et al. | |
| 2014/0099451 A1 | 4/2014 | Mahieu et al. | |

(56) References Cited

U.S. PATENT DOCUMENTS

| | | | |
|---|---|---|---|
| 2014/0216343 A1* | 8/2014 | Maschwitz | C23C 16/402 118/723 E |
| 2014/0220361 A1* | 8/2014 | Maschwitz | C23C 16/402 428/428 |
| 2014/0272388 A1* | 9/2014 | Knight | B23K 10/027 428/335 |
| 2014/0272459 A1 | 9/2014 | Daugherty et al. | |
| 2014/0354119 A1 | 12/2014 | Shishido et al. | |
| 2014/0354149 A1 | 12/2014 | Morgner et al. | |
| 2015/0002021 A1* | 1/2015 | Maschwitz | C23C 16/402 315/111.21 |
| 2015/0004330 A1* | 1/2015 | Maschwitz | C23C 16/402 427/569 |
| 2015/0152542 A1 | 6/2015 | Deppisch et al. | |
| 2015/0235814 A1* | 8/2015 | Kawahara | H01J 37/32568 427/569 |
| 2016/0024657 A1 | 1/2016 | Sakamoto et al. | |
| 2017/0004955 A1 | 1/2017 | Lesser | |
| 2017/0040145 A1 | 2/2017 | Brandon et al. | |
| 2017/0178869 A1* | 6/2017 | Chambers | H01J 37/08 |
| 2018/0025892 A1* | 1/2018 | Biquet | H01J 37/32596 427/569 |

FOREIGN PATENT DOCUMENTS

| | | | |
|---|---|---|---|
| CN | 102099505 A | 6/2011 | |
| CN | 102497721 A | 6/2012 | |
| CN | 102677022 A | 9/2012 | |
| CN | 102771192 A | 11/2012 | |
| CN | 102816987 A | 12/2012 | |
| CN | 103042317 A | 4/2013 | |
| CN | 103493602 A | 1/2014 | |
| CN | 103534383 A | 1/2014 | |
| CN | 103632911 A | 3/2014 | |
| CN | 105427014 A | 3/2016 | |
| DE | 199 02 146 A1 | 8/2000 | |
| EA | 201391765 A1 | 4/2014 | |
| EP | 0727508 A1 | 8/1996 | |
| EP | 0881865 A2 | 12/1998 | |
| EP | 1035561 A2 | 9/2000 | |
| EP | 1913624 A1 | 4/2008 | |
| GB | 1 257 015 A | 12/1971 | |
| JP | S-59228338 A | 12/1984 | |
| JP | S61-238962 A | 10/1986 | |
| JP | 61251021 A * | 11/1986 | C23C 16/4581 |
| JP | S63-297560 A | 12/1988 | |
| JP | H4-180557 A | 6/1992 | |
| JP | H4-358076 A | 12/1992 | |
| JP | H5-226258 A | 9/1993 | |
| JP | H7-73994 A | 3/1995 | |
| JP | 3061288 U | 6/1999 | |
| JP | H11-335868 A | 12/1999 | |
| JP | 2001035692 A | 2/2001 | |
| JP | 2002-121670 A | 4/2002 | |
| JP | 2002-143795 A | 5/2002 | |
| JP | 2003-193239 A | 7/2003 | |
| JP | 2004-533703 A | 11/2004 | |
| JP | 2005-5065 A | 1/2005 | |
| JP | 2005-68444 A | 3/2005 | |
| JP | 2005-243892 A | 9/2005 | |
| JP | 2005-302681 A | 10/2005 | |
| JP | 2006-164683 A | 6/2006 | |
| JP | 2007-026781 A | 2/2007 | |
| JP | 2007-280641 A | 10/2007 | |
| JP | 2008-4814 A | 1/2008 | |
| JP | 2008-112580 A | 5/2008 | |
| JP | 2009-502554 A | 1/2009 | |
| JP | 2009-534797 A | 9/2009 | |
| JP | 2010-021140 A | 1/2010 | |
| JP | 2010530115 A | 9/2010 | |
| JP | 2011-530155 A | 12/2011 | |
| JP | 2013-520836 A | 6/2013 | |
| JP | 2013-0251367 A | 12/2013 | |
| JP | 2014-518947 A | 8/2014 | |
| KR | 2008-0024693 A | 3/2008 | |
| KR | 10-1179650 B1 | 9/2012 | |
| RU | 2239532 C1 | 11/2004 | |
| TW | I235408 A | 1/2005 | |
| TW | I244673 A | 1/2005 | |
| TW | I233144 B | 5/2005 | |
| TW | I294257 A | 2/2007 | |
| TW | 200714742 A | 4/2007 | |
| TW | 200304343 A | 10/2009 | |
| WO | 96/16531 A1 | 5/1996 | |
| WO | 02079815 A2 | 10/2002 | |
| WO | 2005-047180 A1 | 5/2005 | |
| WO | 2007/015779 A2 | 2/2007 | |
| WO | 2012160145 A1 | 11/2012 | |
| WO | 2015/022621 A1 | 2/2015 | |
| WO | 2016/089424 A1 | 6/2016 | |
| WO | 2016/089427 A1 | 6/2016 | |
| WO | 2016/104076 A1 | 6/2016 | |

OTHER PUBLICATIONS

L. Bardos, et al., "Linear Arc Discharge (LAD)—Radio Frequency Hollow Cathode Plasma Source for Low Pressure Processing," 1996 Society of Vacuum Coaters, 39th Annual Technical Conference Proceedings (1996), ISSN 0737-5921, pp. 128-132.

L. Bardos, et al., "PECVD by Hollow Cathodes," 1998 Society of Vacuum Coaters, 41st Annual Technical Conference.Proceedings (1998), ISSN 0737-5921, pp. 315-320.

A. Belkind, et al., "Linear Plasma Source for Reactive Etching and Surface Modification," 1995 Society of Vacuum Coaters, 38th Annual Technical Conference Proceedings (1995), ISSN 0737-5921, pp. 432-436.

J. Madocks, et al., "Large Area Plasma Enhanced Chemical Vapor Deposition of SiO2 on Glass and Plastic," 2007 Society of Vacuum Coaters, 50th Annual Technical Conference Proceedings (2007), ISSN 0737-5921, pp. 233-238.

A.A. Pradhan, et al., "High Deposition Rate Reactive Sputtering with Hollow Cathode," 2002 Society of Vacuum Coaters, 45th Annual Technical Conference Proceedings (2002), ISSN 0737-5921, pp. 96-100.

C. M. Horwitz, "Silicon deposition in diode and hollow-cathode systems," 1989 American Vacuum Society, J. Vac. Sci. Technol. B 7 (3), May/Jun 1989, pp. 443-449.

S.K. Deb, "The Role of Vacuum Coatings in Cost-Effective Photovoltaic Technologies," Society of Vacuum Coaters, 51st Annual Technical Conference Proceedings, Apr. 19-24, 2008, ISSN 0737-5921, pp. 101-106.

M. Mildner et al., "13.56 MHz hollow cathode jet matrix plasma source for large area surface coating," Surface and Coatings Technology, vol. 112, pp. 366-372, XP000983344 (1999).

D. Child et al., "Enhanced Hollow Cathode Plasma Source for Low Pressure Electron-Beam Deposition Processes", 2014 Society of Vacuum Coaters 505/856-7188, ISSN 0737-5921, May 2014, 6 pages.

B. Buchholtz, "Physics of Ion Beam Sources" 7 pages.

M. Proschek et al., "The effect of phase difference between powered electrodes on RF plasmas", Plasma Sources Sci. Technol. 14, 2005, 407-411.

Chinese Office Action, issued in CN 200980139450.6 dated Dec. 29, 2014, including English language translation, 9 pages.

Extended European Search Report, issued in EP 09805431.5 dated Aug. 4, 2014, 16 pages.

European Search Report, issued in EP 09805431.5 dated Apr. 8, 2016, 6 pages.

Indian First Examination Report issued in in 357/MUMNP/2011 dated Aug. 21, 2017, including English language translation, 10 pages.

Japanese Office Action issued in JP 2011-522159 dated Jun. 25, 2013, including English language translation, 8 pages.

Japanese Office Action issued in JP 2011-522159 dated Mar. 18, 2014, including English language translation, 8 pages.

Japanese Office Action, issued in JP 2015-134085 dated Aug. 23, 2016, including English language translation, 9 pages.

(56) References Cited

OTHER PUBLICATIONS

Japanese Office Action, issued in JP 2015-134098 dated Aug. 30, 2016, including English language translation, 10 pages.
Japanese Office Action, issued in JP 2015-134106 dated Aug. 30, 2016, including English language translation, 10 pages.
Japanese Office Action, issued in JP 2015-134112 dated Aug. 2, 2016, including English language translation, 5 pages.
Japanese Office Action, issued in JP 2015-134116 dated Aug. 30, 2016, including English language translation, 10 pages.
Japanese Office Action, issued in JP 2015-134098 dated Jan. 10, 2017, including English language translation, 11 pages.
Japanese Office Action, issued in JP 2015-134116 dated Mar. 28, 2017, including English language translation, 9 pages.
Japanese Office Action, issued in JP 2015-134112 dated Jul. 4, 2017, including English language translation, 5 pages.
Korean Office Action, issued in KR 10-2011-7005282 dated Aug. 22, 2015, including English language translation, 21 pages.
Taiwanese Office Action, issued in TW 098126292 dated Mar. 23, 2015, including English language translation, 41 pages.
Taiwanese Office Action, issued in TW 10521126650, dated Sep. 9, 2016, including English language translation, 10 pages.
Taiwanese Office Action, issued in TW 10521126670, dated Sep. 9, 2016, including English language translation, 9 pages.
Taiwanese Office Action, issued in TW 105103045, dated Dec. 30, 2016, including English language translation, 7 pages.
Non-final Office Action, issued in U.S. Appl. No. 14/942,737, dated Sep. 22, 2016, 53 pages.
Non-final Office Action, issued in U.S. Appl. No. 14/486,779, dated Mar. 24, 2017, 80 pages.
Non-final Office Action, issued in U.S. Appl. No. 14/148,606, dated Apr. 6, 2017, 36 pages.
Non-final Office Action, issued in U.S. Appl. No. 14/975,286, dated Apr. 7, 2017, 61 pages.
Non-final Office Action, issued in U.S. Appl. No. 14/975,415, dated Apr. 14, 2017, 69 pages.
Final Office Action, issued in U.S. Appl. No. 14/486,726, dated May 17, 2017, 38 pages.
Non-final Office Action, issued in U.S. Appl. No. 15/645,774, dated Aug. 28, 2017, 58 pages.
Philippine Office Action issued in PH 1/2011/500255 dated Jul. 16, 2013, 1 page.
Office Action issued for Eurasian Patent Application No. 201791237 dated Dec. 26, 2018, along with English translation, 4 pages.
Office Action issued for Chinese Patent Application No. 20148004528.X dated Feb. 28, 2019, along with English translation, 18 pages.
Office Action issued for Japanese Patent Application No. 2017-146662 dated Mar. 26, 2019, along with English translation, 11 pages.
Examination Report, in corresponding Philippine Patent Application No. 1/2015/500539, dated Apr. 10, 2019, 5 pages.
Office Action issued for U.S. Appl. No. 15/532,855 dated May 2, 2019, 57 pages.
Office Action issued for Japanese Patent Application No. 2018-532069 dated May 28, 2019, along with English translation, 15 pages.
Office Action issued for Chinese Patent Application No. 201510505370.5 dated Dec. 14, 2018, along with English translation, 6 pages.
Office Action issued for Chinese Patent Application No. 201480084542.X dated Dec. 29, 2018, along with English translation, 24 pages.
International Search Report and Written Opinion dated Feb. 24, 2015, in International Application No. PCT/US2014/068919, 13 pages.
Office Action issued in Brazilian Patent Application No. P10916880-0 dated May 28, 2019, 7 pages.
Extended European Search Report issued in European Patent Application No. 16866871.3, dated Jul. 3, 2019, 10 pages.
Substantive Examination Report issued in Philippine Patent Application No. 1/2015/500541, dated Jul. 5, 2019, 7 pages.
Extended European Search Report issued in European Patent Application No. 16876262.3, dated Jul. 19, 2019, 11 pages.
Office Action issued in Chinese Patent Application No. 201680078860.4, dated Aug. 1, 2019, with English translation, 31 pages.
Office Action issued in Indonesian Patent Application No. P-00201702394 dated Aug. 19, 2019 (no English translation), 3 pages.
Office Action issued in Eurasian Patent Application No. 201791234, dated Aug. 27, 2019, with English translation, 3 pages.
Office Action issued in Eurasian Patent Application No. 201791237, dated Aug. 29, 2019, with English translation, 3 pages.
Office Action issued in Chinese Patent Application No. 201480084542.X, dated Sep. 11, 2019, with English translation, 22 pages.
Office Action issued in Chinese Patent Application No. 201680081988.6, dated Sep. 25, 2019, with English translation, 35 pages.
Office Action issued in Indonesian Patent Application No. P-00201704208, dated Oct. 8, 2019 (no English translation), 3 pages.
Office Action issued in Eurasian Patent Application No. 201891175, dated Oct. 16, 2019, (no English translation), 2 pages.
Office Action issued for Japanese Patent Application No. 2017-529720 dated Jul. 23, 2019, along with English translation, 17 pages.
Office Action issued for Japanese Patent Application No. 2017-146662 dated Aug. 7, 2018, along with English translation, 6 pages.
Office Action issued for Japanese Patent Application No. 2015-134106 dated Aug. 28, 2018, along with English translation, 13 pages.
Office Action issued for Chinese Patent Application No. 201510505381.3, dated Feb. 1, 2018, along with the corresponding English translation (15 pages).
Office Action issued for Chinese Patent Application No. 201510505370.5, dated Feb. 5, 2018, along with the corresponding English translation (23 pages).
Office Action issued for U.S. Appl. No. 15/645,774 dated Mar. 9, 2018 (25 pages).
Office Action issued for Japanese Patent Application No. 2017-093637 dated May 29, 2018, along with English translation, 10 pages.
Office Action issued in Chinese Patent Application No. 201480084528.X, dated Nov. 7, 2019, with English translation, 16 pages.
Office Action issued for Chinese Patent Application No. 201510505383.2 dated Feb. 1, 2018, along with English translation (4 pages).
Office Action issued for Japanese Patent Application No. 2017-529717 dated Nov. 27, 2018, along with English translation, 4 pages.
Office Action issued for U.S. Appl. No. 14/975,415 dated Dec. 13, 2018, 16 pages.
Office Action issued for Eurasian Patent Application No. 201791234 dated Dec. 11, 2018, along with English translation, 2 pages.
Office Action issued in U.S. Appl. No. 14/148,606 dated Apr. 5, 2018, (18 pages).
Communication issued in European Patent Application No. 09805431.5 dated Apr. 12, 2018 (10 pages).
Office Action issued in U.S. Appl. No. 14/975,286 dated Oct. 23, 2017, 17 pages.
Notification of Reasons for Rejection issued in Japanese Application No. 2015-134116 dated Oct. 24, 2017, along with English translation, 9 pages.
Chinese Office Action, issued in CN 201510505383.2 dated May 17, 2017, including English language translation, 24 pages.
Chinese Office Action, issued in CN 201510505381.3 dated Jun. 5, 2017, including English language translation, 19 pages.
Chinese Office Action, issued in CN 201510505370.5 dated Jul. 21, 2017, including English language translation, 23 pages.
Office Action issued for U.S. Appl. No. 14/975,415 dated May 4, 2018, 18 pages.
Office Action issued for Japanese Patent Application No. 2017-529720 dated Sep. 25, 2018, along with English translation, 12 pages.
Office Action issued for U.S. Appl. No. 15/532,855 dated Oct. 12, 2018, 19 pages.

(56) References Cited

OTHER PUBLICATIONS

Office Action issued for U.S. Appl. No. 15/645,774 dated Oct. 18, 2018, 28 pages.
Office Action issued for U.S. Appl. No. 14/486,726 dated Jun. 22, 2018, 48 pages.
Office Action issued for U.S. Appl. No. 14/975,286 dated Jun. 28, 2018, 44 pages.
Office Action issued for U.S. Appl. No. 15/645,774 dated Jul. 12, 2018, 63 pages.
Examination Report, in corresponding Philippine Application No. 1/2015/500540, dated May 8, 2018, 2 pages.
Extended European Search Report dated Jul. 3, 2018, issued in European Patent Application No. 14907243.1, 10 pages.
Extended European Search Report dated Jul. 16, 2018, issued in European Patent Application No. 14907576.4, 9 pages.
Office Action issued in U.S. Appl. No. 14/486,779 dated Sep. 28, 2017, 8 pages.
Office Action issued in U.S. Appl. No. 14/486,726 dated Oct. 6, 2017, 15 pages.
Office Action issued in U.S. Appl. No. 14/148,606 dated Oct. 10, 2017, 18 pages.
Office Action issued in U.S. Appl. No. 14/975,415 dated Oct. 19, 2017, 17 pages.
Office Action issued in Chinese Patent Application No. 201480084542.X, dated Mar. 2, 2020, with English translation, 17 pages.
Office Action issued in Indonesian Patent Application No. P-00201704208, dated Feb. 3, 2020, with English Translation, 5 pages.

* cited by examiner

PLASMA SOURCE UTILIZING A MACRO-PARTICLE REDUCTION COATING AND METHOD OF USING A PLASMA SOURCE UTILIZING A MACRO-PARTICLE REDUCTION COATING FOR DEPOSITION OF THIN FILM COATINGS AND MODIFICATION OF SURFACES

CROSS REFERENCE TO RELATED APPLICATION(S)

This application is a 35 U.S.C. § 371 National Phase Entry Application from PCT/US2014/068919, filed Dec. 5, 2014, designating the United States. This application is related to PCT International Application Ser. No. PCT/US2014/068858, titled "Hollow Cathode Plasma Source," the disclosure of which is incorporated herein by reference.

BACKGROUND OF THE INVENTION

Field of the Invention

The present invention relates generally to a plasma source utilizing a macro-particle reduction coating and method of using a plasma source utilizing a macro-particle reduction coating for deposition of thin film coatings and modification of surfaces. More particularly, the present invention relates to a plasma source comprising one or more plasma-generating electrodes, wherein a macro-particle reduction coating is deposited on at least a portion of the plasma-generating surfaces of the one or more electrodes to shield the plasma-generating surfaces of the electrodes from erosion by the produced plasma and to resist the formation of particulate matter, thus enhancing the performance and extending the service life of the plasma source.

Discussion of the Background

All United States Patents and Patent Applications referred to herein are hereby incorporated by reference in their entireties. In the case of conflict, the present specification, including definitions, will control.

The deposition of thin films can be accomplished by many techniques, the most common including chemical deposition, physical deposition and mixtures of the two. For chemical deposition, well-known techniques are plating, chemical solution deposition (CSD) and chemical vapor deposition (CVD). Plating and CSD generally utilize liquid chemical precursors while CVD generally utilizes gaseous chemical precursors. These techniques can be done at atmospheric pressure or under vacuum conditions. For physical deposition, well-known techniques are thermal evaporation, sputtering, pulsed laser deposition and cathodic arc deposition. These physical deposition techniques generally utilize vacuum conditions in order to deposit the desired thin film materials. With respect to chemical deposition, the most common technique is CVD, whereas for physical deposition, the most common technique is sputtering.

CVD generally requires that an energy source be included in order to create conditions such that a precursor gas will adhere, or stick, to a substrate surface. Otherwise, adhesion to a surface will not occur. For example, in a pyrolytic CVD process whereby a thin film coating is desired on a flat glass substrate, it is typical for the glass substrate to be heated. The heated glass substrate may be newly formed glass on a float glass line, or pre-formed glass that is heated specifically for CVD. The heated glass substrate acts as the CVD energy source and when the precursor gas contacts the heated glass substrate, the precursor gas adheres to the hot glass surface. The heated surface also provides the energy needed to cause the precursor gas to chemically react to form the final thin film coating composition.

The required energy for a CVD-type process may also be applied through the formation of a plasma, with this more specific process being known as plasma enhanced CVD, or PECVD. A plasma is composed of a partially ionized gas and free electrons, and each component has the ability to move somewhat independently. This independent movement makes the plasma electrically conductive, such that it can respond to electromagnetic fields. PECVD processes can provide a number of advantages over other known chemical and physical deposition techniques, including higher deposition rates and increased flexibility of deposition conditions and materials. In view of these advantages, PECVD processes have gained wide acceptance in the thin film coating industry.

In a PECVD process, the depositing material is typically derived from a precursor gas. A precursor gas is non-adherent, i.e. not prone to attaching on a surface until energized, partially decomposed, or fully decomposed by an energy source. Once a precursor gas has been energized, partially decomposed, or fully decomposed, chemical fragments of the precursor gas containing the desired chemical elements for coating become condensable molecular entities which are chemically able to bond to or condense upon a surface in a solid form. Examples of such precursor gases are well-known to those of skill in the art. For example, if an Si-based thin film is to be deposited, a common precursor gas is silane, $SiH_4$. When $SiH_4$ is subject to a source of plasma, the plasma can act to raise the energy level of the silane molecule to the point where portions of it will condense on a surface and form a solid layer. More specifically, the $SiH_4$ becomes ionized, with its electrons moving to a higher energy level. This is accompanied by subsequent stripping off of the hydrogen atoms. The ionized molecules have open reactant sites available and, if in the presence of a reactant gas such as oxygen, can readily form a thin film of $SiO_2$. If the ionized molecules are not in the presence of a reactant gas, a thin film of silicon can be formed. The precursor chemistry exists for a plethora of elements, and thus, there is a large availability of elements and materials that can be deposited by PECVD. Without limitation, the types of thin films that can be deposited by PECVD are transparent conductive oxide thin film coatings, solar control and optical thin film coatings and semiconductor thin film coatings. Other types of thin film coatings that are able to be deposited by PECVD will be recognized and appreciated by those of ordinary skill in the art.

Similar plasma sources may be utilized without the presence of a precursor gas for surface modification or treatment of substrates. During surface modification or treatment, plasma energy is imparted onto the substrate surface for specific process needs, such as the removal of organic molecules by way of exposure to an oxygen plasma.

Thus, creating a plasma in proximity to a surface is a common industrial practice, particularly in the coating industry. Many devices have been developed to create and shape plasmas, having numerous practical applications for coatings and surface treatment. For example, point plasma sources create a column of plasma that can be used to deposit coatings or for surface treatment of small-area substrates. Linear plasmas may, however, have potential for more practical applications than point plasma sources. Linear plasmas can be made to work over large substrate surface areas, which is useful for large area glass coating, web coating and multipart batch coating. Many known PECVD apparatuses are for small scale (i.e. <1 m$^2$) depositions since most plasma sources are very short and can only coat small areas.

When large substrates are to be coated, the plasma sources used are typically linear ionic sources, like the one disclosed by Madocks in U.S. Pat. No. 7,411,352. This plasma source is based on a magnetron discharge and produces a linear beam of ions or, by combining several sources, multiple parallel beams of ions directed towards the substrate surface. Madocks discloses that, for coating purposes, a coating precursor can be provided outside of the plasma source. The precursor gas is activated by the plasma and ion beams. A substrate is conveyed adjacent to the source, and a thin film is deposited on the substrate from the activated gas.

Notably, Madocks discloses that, during operation of the disclosed source, the electrodes contained within the source are sputtered, and that the sputtered material redeposits and remains within the source. Sputtering of the electrode material within a plasma source is a significant problem encountered during the use of many known plasma sources. Electrode sputtering is a particularly significant problem in the field of glass coating, which requires continuous operation of the plasma sources for 100 to 600 hours, above a substrate undergoing a process which is very sensitive to the presence of foreign particles. Electrode sputtering during extended plasma source operation results in reduced service life of the electrodes. If the sputtered material reacts with the plasma gas and redeposits on the electrodes themselves, non-conductive nodules may form on the electrode surface. The redeposition of the sputtered material may also lead to blockage of the nozzles of the plasma source, making a uniform substrate treatment or coating impossible. Furthermore, depending on the electrode material and the plasma-forming gas, the sputtering of the electrode may lead to the formation of particulate debris. The debris may further block the source's nozzles, or fall on the substrate creating defects.

Thus, there remains a need in the art for an improved PECVD source that avoids the problems of earlier-developed PECVD sources. Specifically, there is a need in the art for a plasma source in which erosion of plasma-source components by the produced plasma and subsequent formation of particulate matter is reduced. There is further a need in the art for a plasma source providing a stable operating voltage, requiring reduced maintenance, and having an extended service life.

SUMMARY OF THE INVENTION

In one or more aspects of the invention, there is provided a macro-particle reduction coating on a plasma-generating surface of an electrode that has the desired morphology and composition for electron emission, plasma generation and stability, and is able to achieve at least one or more of the following: a low chemical reaction rate with plasma, a low sputtering rate, a reduction in particulate debris formation, and reduced production of reaction products that may contaminate thin film deposition.

In one or more other aspects of the invention, there is provided an electrode positioned in a plasma source, wherein a macro-particle reduction coating is deposited on at least a portion of a plasma-generating surface of the electrode.

In one or more other aspects of the invention, there is provided a plasma source, wherein the plasma source comprises at least one electrode coated with a macro-particle reduction coating.

In one or more other aspects of the invention, there is provided a method for depositing a thin film coating or performing surface treatment of a substrate using a plasma source incorporating one or more electrodes that are coated with a macro-particle reduction coating.

In one or more other aspects of the invention, there is provided a method for stabilizing the voltage output of a plasma source.

In one or more other aspects of the invention, there is provided a method for extending the service life of an electrode and a plasma source incorporating the electrode.

In one or more other aspects of the invention, there is provided a coating deposited on a substrate, wherein the coating is deposited using an electrode coated with a macro-particle reduction coating.

These and other aspects are achieved, in accordance with embodiments of the invention, by providing an electrode positioned in a plasma source device, the electrode comprising a first plasma-generating surface of the electrode and a macro-particle reduction coating deposited on at least a portion of the first plasma-generating surface of the electrode. The portion of the first plasma-generating surface on which the macro-particle reduction coating is deposited is shielded from contact with the plasma by the macro-particle reduction coating. The electrode is electrically connected to a power source for supplying a voltage that alternates between positive and negative, and is configured to generate a plasma proximate to the first plasma-generating surface of the electrode.

During plasma source operation, the coating on the electrode directly contacts a plasma-forming gas, and is substantially resistant to chemical reaction with the plasma-forming gas. The coating resists chemical reaction with the plasma-forming gas for at least 100 hours, or at least 300 hours of continuous plasma-source operation. In exemplary embodiments, the coating resists chemical reaction with the plasma-forming gas during extended plasma source operation at high power densities, i.e. when the power input per meter of plasma length is greater than 20 kw, or greater than 40 kw.

In an additional embodiment of the invention, a plasma source is provided. The plasma source comprises a first electrode and a second electrode separated by a gas containing space. The first and second electrodes are electrically connected to a power source, which is configured to supply a voltage that alternates between positive and negative to cause the voltage supplied to the first electrode to be out of phase with the voltage supplied to the second electrode, creating a current that flows between the electrodes. The current creates a plasma between the electrodes that is substantially uniform over its length. In embodiments, the plasma is created in the substantial absence of closed circuit electron drift. In this source, at least a portion of each of the first electrode and the second electrode are coated with a macro-particle reduction coating. The electrodes are thus shielded from contact with the plasma by the coating. The coating is resistant to forming particulate matter.

The plasma source, in some embodiments of the invention, may be configured to deposit a coating using plasma enhanced chemical vapor deposition (PECVD). When configured for PECVD, a gas inlet configured to supply a precursor gas and a gas inlet configured to supply a plasma gas are included. The precursor gas is activated by the plasma. A substrate is conveyed adjacent to the source, and a thin film is deposited on the substrate from the activated gas. The inventors of the subject matter described herein have found that when incorporated into a plasma source, electrodes coated at least partially with the macro-particle reduction coatings disclosed herein serve to improve the function of and increase the service life of the plasma source, while also providing numerous additional benefits. These benefits include: 1) greatly reduced sputter erosion of the electrodes; 2) extension of the source service life; 3) enhanced process performance; 4) stabilized voltage output.

DETAILED DESCRIPTION OF THE INVENTION

Figure 1:
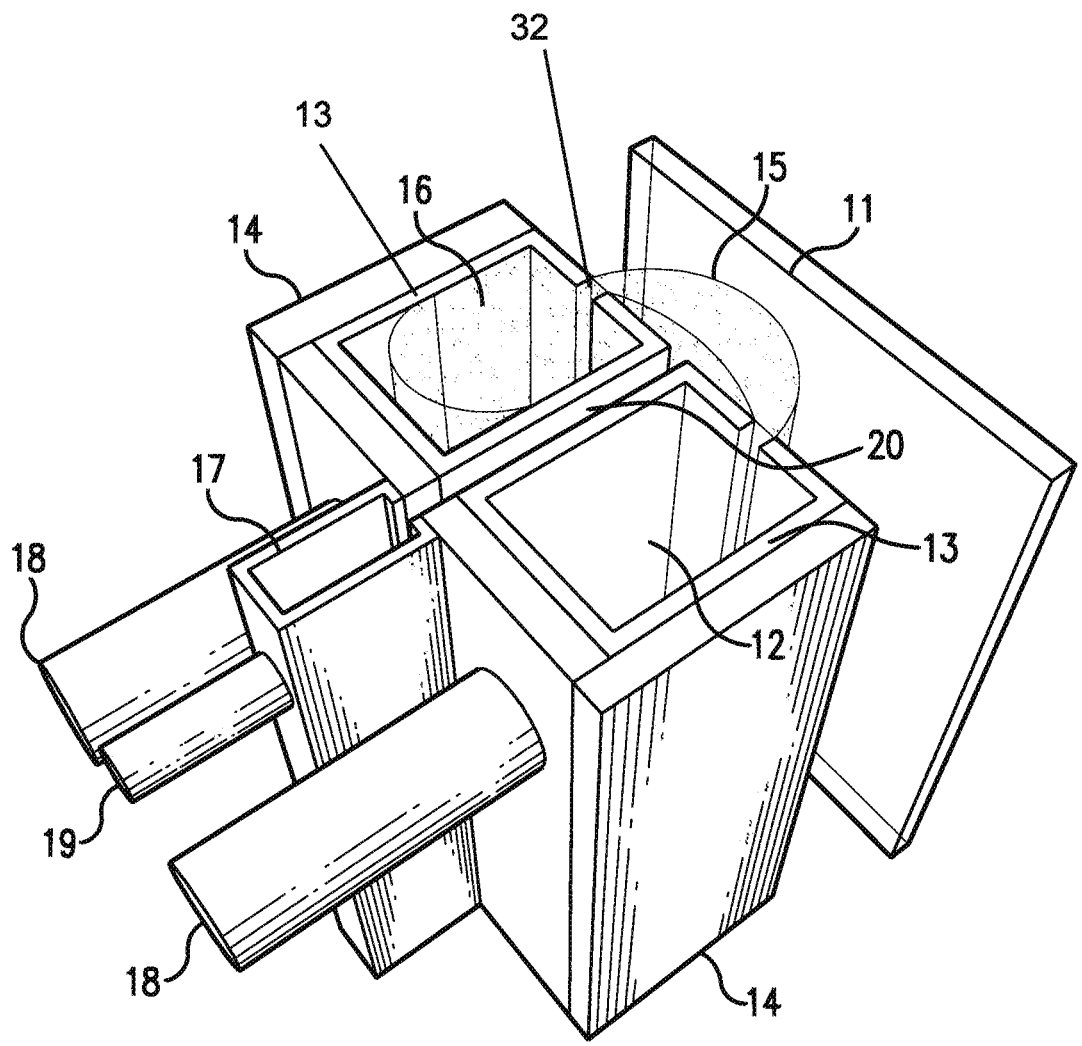
FIG. 1 shows a prior art plasma source, which contains uncoated electrodes.

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

As referred to herein, "plasma" is taken to mean an electrically conductive gaseous medium comprising both free electrons and positive ions. Traditionally, high intensity plasma of inert gas (e.g., argon, helium, krypton, neon, xenon) has been used during thin film coating processes. However, the increasing complexity and variety of thin film coatings has created a need for high intensity plasma comprising one or more reactive plasma forming gases such as oxygen and nitrogen. Plasmas may alternatively be formed using hydrogen or ammonia gas.

"Precursor gas" is taken to mean a gas in molecular form containing a chemical element or elements to be condensed into a solid coating. The elements to be condensed from the precursor gas may include metals, transition metals, boron, carbon, silicon, germanium and/or selenium. The choice of precursor gas is generally governed by several considerations, including stability at room temperature, ability to react cleanly in the reaction zone, and sufficient volatility at low temperature so that it can be easily transported to the reaction zone without condensing in the lines. Precursor molecules do not condense at the process pressure and temperature. In fact, a precursor molecule is unreactant or not prone to attaching on a surface until energized, partially decomposed, or fully decomposed by an energy source, whereupon a chemical fragment of the precursor gas containing the desired chemical element for coating becomes chemically able to bond to or condense upon a surface in a solid form. The condensed portion of the precursor compound may be primarily a pure element, a mixture of elements, a compound derived from the precursor compound constituents or a mixture of compounds.

It is often desirable to deposit compounds on a surface which may not be chemically available from the precursor gas alone. Accordingly, "reactant gases" such as oxygen and nitrogen may be added to the CVD process to form oxides or nitrides. Other reactant gases include fluorine, chlorine, other halogens, nitrous oxide, ammonia and hydrogen. A reactant gas may be differentiated from a precursor gas by the fact that even when energized or chemically decomposed, condensable molecular entities are not formed. Generally, reactant gases or reactant gas fragments cannot by themselves grow a solid deposition but they can react and become chemically incorporated into a solid deposition derived from precursor gases or other solid deposition sources. In many cases, the plasma gas acts as a reactant gas, and chemical fragments of plasma gas molecules become chemically incorporated into the deposited film. In other cases, a reactant gas may be provided separately from and in addition to the plasma gas.

"Chemical Vapor Deposition" or "CVD" is taken to mean the deposition of a film on a substrate from a chemical reaction in the vapor phase. In Plasma Enhanced Chemical Vapor Deposition or PECVD, a plasma-forming gas is chemically activated by supplying electrical power to the plasma-forming gas, generally at reduced pressures. The application of sufficiently high voltage causes breakdown of the plasma-forming gas, and a plasma appears, which consists of electrons, ions and electrically excited species. The energetic electrons in the plasma ionize the plasma forming gas, or may dissociate the molecules of the gas into smaller species called radicals. Radicals are species that, upon collision with a surface, react to form a thin film. The species deposited by CVD or PECVD may be atoms or molecules, or a combination of these.

"Dark space" is taken to mean a narrow zone or area around an electrode wherein plasma current is very low. Generally, two oppositely charged plasma electrodes or a plasma electrode and a ground potential conductor spaced apart by a dark space distance will exhibit substantially no current flow between them.

"Hollow Cathode" is taken to mean an electrode typically comprised of electron-emitting surfaces that define a cavity.

Hollow cathode cavities may be formed in many shapes, including rectangular, rounded rectangular (i.e. rectangular with rounded corners or edges), circular, oblong, elliptical, or oval. Hollow cathodes typically comprise an inlet for plasma and/or reactant gas, and a plasma outlet. Hollow cathodes can be connected to a source of alternating current, such that the polarity of the electrode alternates between positive (anode) and negative (cathode). When the electron-emitting surfaces of a hollow cathode have a negative potential, electrons oscillate between the surfaces and are thereby confined in the cavity.

"Hollow cathode plasma source," is taken to mean a plasma or ion source comprising one or more electrodes configured to produce hollow cathode discharges. One example of a hollow cathode plasma source is described in commonly-owned U.S. Pat. No. 8,652,586 to Maschwitz ("Maschwitz '586"), incorporated herein by reference in its entirety. FIG. 1 shows a prior art hollow cathode plasma source similar to that disclosed in Maschwitz '586. The plasma source comprises at least two hollow cathode electrodes 13, arranged in parallel and connected via an AC power source. The AC power source supplies a varying or alternating bipolar voltage to the two electrodes. The AC power supply initially drives the first electrode to a negative voltage, allowing plasma formation, while the second electrode is driven to a positive voltage in order to serve as an anode for the voltage application circuit. This then drives the first electrode to a positive voltage and reverses the roles of cathode and anode. As one of the electrodes is driven negative 13, a discharge 16 forms within the corresponding cavity. The other electrode then forms an anode, causing electrons to escape the plasma and travel to the anodic side, thereby completing an electric circuit. A plasma 15 is thus formed in the region between the first and the second electrodes. This method of driving hollow cathodes with AC power contributes formation of a uniform linear plasma.

"Substrate" is taken to mean either a small area or large area item to be coated or have its surface chemically modified by this invention. A substrate, as referred to herein, can be comprised of glass, plastic, metal, inorganic materials, organic materials or any other material that has a surface to be coated or modified.

"Closed circuit electron drift" is taken to mean an electron current caused by crossed electric and magnetic fields. In many conventional plasma forming devices the closed circuit electron drift forms a closed circulating path or "racetrack" of electron flow.

"AC power" is taken to mean electric power from an alternating source wherein the voltage is changing at some frequency in a manner that is sinusoidal, square wave, pulsed or some other waveform. Voltage variations are often from negative to positive, i.e. with respect to ground. When in bipolar form, power output delivered by two leads is generally about 180° out of phase.

"Electrodes" provide free electrons during the generation of a plasma, for example, while they are connected to a power supply providing a voltage. The electron-emitting surfaces of a hollow cathode are considered, in combination, to be one electrode. Electrodes can be made from materials well-known to those of skill in the art, such as steel, stainless steel, copper, or aluminum. However, these materials must be carefully selected for each plasma-enhanced process, as different gasses may require different electrode materials to ignite and maintain a plasma during operation.

"Thin film" or "thin film coating" or "thin film stack" refers to one or more microscopically thin layers deposited on a substrate. Thin film coatings are incorporated into many modern devices such as low emissivity ("low E") windows, semiconductor chips, photovoltaic devices, machine tools, and automotive components in order to maximize their performance and service life.

"Surface modification" or "surface treatment" is taken to mean one or more processes performed on a substrate including heat treatment, coated layer heat annealing, surface cleaning, surface chemical functionalization, crystal structure modification of coated layers, ion bombardment, and ion implantation.

"Macro particles" or "particulate debris," as referred to herein, comprise sputtered electrode material that has detached from electrode surfaces. Macro particles are typically large enough to see with the naked eye, with dimensions ranging from 0.1 mm to 5 mm. During large area glass coating, the coating sources are often positioned above the substrate surfaces being coated. Thus, the shedding of particulate debris from coating apparatus components (e.g. from plasma-forming electrodes) is a significant concern in the field. Particulate debris formation and subsequent shedding onto substrate surfaces is highly undesirable, resulting in coating pinholes and various other problems on the coated substrate.

The macro-particle reduction coatings of the instant invention are designed to have numerous advantageous properties that enhance process uniformity and service life of the electrodes and plasma sources.

First, in exemplary embodiments of the present invention, the macro-particle reduction coatings have a low sputtering yield. Specifically, the sputter yield of the coatings is significantly below that of uncoated stainless steel. When an inert gas such as argon is used as a plasma-forming gas, the sputter yield is preferably below 1.0 atoms per ion at 100 eV ion energies, more preferably below 0.5 atoms per ion at 100 eV ion energies, and even more preferably between 0.2 atoms per ion at 100 eV ion energies.

When plasma-forming gas, such as oxygen or nitrogen, contacts the electron emitting surfaces of uncoated electrodes, the plasma-forming gas may chemically react with these surfaces to produce reaction products. The formation of such reaction products may interfere with plasma uniformity and have a negative impact on the deposited films. For example, when stainless steel electrodes are used to form an oxygen plasma, the oxygen reacts with the surface of the stainless steel electrodes, causing the formation of a thin oxide layer on the surface of the electrodes. Eventually, the reaction products may accumulate and form non-conductive nodules. The formation of reaction products such as oxide layers and non-conductive nodules on the surfaces of the plasma-forming electrode inhibits plasma formation at the surface of the electrode on which they are formed. To maintain constant power, the voltage supplied to the electrodes must be increased during extended operation of a plasma source.

Accordingly, it is advantageous to provide an electrode coating material which is sufficiently chemically resistant to the chosen plasma in terms of both gas species and power input level. Even though a coating material, such as carbon, may be sufficiently resistant to sputtering, if it is paired with an incompatible plasma gas, such as oxygen, then sufficient performance will not be achieved. In this example, chemical reaction between the coating and the plasma will quickly erode the coating. Additionally, in some cases, chemical reaction between the coating material and the plasma will produce reaction products which are detrimental to the coating process. Further, increasing power input to the coated electrode will generate increased plasma energy and electrode surface heating, which may facilitate reactions between electrode coating materials and plasma gas(es) that would not otherwise occur. For example, with oxygen used as the plasma gas in a hollow cathode type plasma source at relatively high power input levels (e.g. greater than or equal to 20 or 40 kW per linear meter of plasma length), carbon coatings will rapidly erode, chromium carbide coatings will form a fine particulate debris with generally all pieces being less than 0.5 mm in size, while tungsten carbide coatings will form a much lower number of larger particles of various sizes of less than around 4 mm. Metals or metal alloys used for binders or plating must be similarly resistant and also produce acceptable byproducts to the process at a required power input level.

In exemplary embodiments of the present invention, the macro particle reduction coatings are conductive; i.e. having a resistivity less than $10^7$ ohm cm, preferably less than $10^5$ ohm cm, and even more preferably less than $10^3$ ohm cm.

The inventors have surprisingly found that selected materials used alone and/or in various combinations are capable of producing a coating capable of reducing macro-particle generation compared to the use of uncoated electrodes. The coating materials described herein were selected as coating materials because they have one or more of the advantageous properties listed above, including high hardness, high melting point, high reaction/oxidation resistance and/or low sputter yield.

In a first embodiment, the macro-particle reduction coatings are conductive materials which comprise selected metals characterized by ionic or covalent bonding. Coatings according to this embodiment may comprise elements selected from the group consisting of boron, carbon, nitrogen, aluminum, silicon, transition metals, or combinations thereof. For example, the coatings may comprise boron carbide, silicon carbide, or aluminum carbide. The coatings according to this embodiment may further comprise a second material, selected from the group consisting of tungsten, chromium, titanium, molybdenum, and zirconium. For example, the coatings may comprise tungsten carbide (WC) or chromium carbide ($Cr_3C_2$). The macro particle reduction coatings of the first embodiment may comprise one or more materials selected from the group consisting of conductive oxides and ceramics. Few ceramic materials exhibit the requisite conductivity to provide for plasma generation when applied to the surface of an electrode. However, the inventors have surprisingly found that selected conductive ceramics, including tungsten carbide, boron carbide, silicon carbide, aluminum carbide and chromium carbide, are sufficiently conductive to allow for plasma formation when deposited on the surface of a plasma-forming electrode, while also serving as effective macro-particle reduction coatings. In other embodiments, the coatings may achieve conductivity by mixing the coating material with a dopant. For example, indium oxide doped with tin may be used form a conductive coating consisting of a solid solution of $In_2O_3$ and $SnO_2$.

In this first embodiment, molecular bond energy, to a large extent, determines the degree of hardness, melting point, oxidation resistance and sputter yield. Bond energy may be quantified in units of electron volts (ev) per molecule. The inventors have found that with increasing bond energy of the coatings, macro-particle generation is reduced, and that coatings having bond energies greater than 12 ev per molecule are particularly advantageous. Examples of such coatings having high bond energies (greater than 12 ev per molecule) include coatings comprising metal-carbon compounds (carbides), such as titanium carbide, zirconium carbide, hafnium carbide, chromium carbide, and tantalum carbide.

Additionally, in other embodiments, the macro-particle reduction coatings may comprise selected metals or metal alloys. The coatings according to this embodiment preferably comprise greater than 50 weight percent of one or more materials selected from the group consisting of cobalt, molybdenum, nickel, chromium, and alloys thereof. Optionally, the coatings may additionally comprise less than or equal to 49 weight percent of aluminum or silicon. The coatings according to this embodiment may contain ionic or covalent bonding.

The primary considerations for macro-particle reduction coating material selection are sufficient resistance to chemical reaction with the plasma gas and sufficiently low sputter yield when exposed to the plasma. Sputter yields should generally be below about 1 atom per ion when exposed to argon ions with energies of about 500 eV. More preferably, sputter yields should be below about 0.5 atoms per ion when exposed to argon ions with energies of about 500 eV. In cases where the sputter yield is in the range of about 0.5 atoms per ion to 1 atom per ion when exposed to argon ions with energies of about 500 ev, the inventors have surprisingly found that the combination of electrode coating, electrode geometry, plasma gas, and plasma input power can be configured such that the majority of sputtered atoms will be redeposited on opposing electrode surfaces without forming particulate debris, effectively contributing back to the overall electrode coating. This provides for minimal net erosion of the coating, and minimal debris formation, even while the coating undergoes substantial sputtering. Coatings material having this surprising result include, for example, cobalt, and nichrome alloys.

In certain alternative embodiments, one or more of the materials listed above may be combined to form a coating.

The coatings of the instant invention may be deposited on electron-emitting surfaces of electrodes using methods which are well-known in the art, including spray coating, electroplating, chemical vapor deposition (CVD), and physical vapor deposition (PVD). Whether a particular coating technique is appropriate for coating an electron-emitting surface for use in a particular application requires several considerations. First, the technique must be able to produce a coating with a desirable density and porosity for the particular application, but with minimal impurities, such as oxide or nitride impurities. The technique should also be able to produce a coating of an appropriate thickness that resists substantial peeling or cracking.

The coatings of the instant invention may be deposited on electrodes by thermal spray coating according to standard methods known to those of skill in the art. Thermal spray coating can be used to produce coatings with the desired composition, structure, morphology, and thickness. Several different thermal spray coating techniques exist, including plasma spraying, detonation spraying, wire arc spraying, flame spraying, high velocity oxygen-fuel spraying, warm spraying, and cold spraying. The coatings of the present invention are preferably deposited by plasma thermal spray coating. However, choice of a particular process will depend on the exact material to be deposited, the preferred equipment, and budget concerns.

In some embodiments of the instant invention, a binder is added to the coating composition before deposition in order to increase adhesion and durability of the coating on the electrode surface. The binder may comprise a single material, such as cobalt, molybdenum, nickel, or chromium.

Alternatively, the binder may comprise a mixture of materials, such as a mixture of nickel and chromium or a mixture of nickel and cobalt. In some embodiments, the binder comprises about 5-30 weight percent of the final coating. More preferably, the binder comprises 10-15 weight percent of the final coating.

The macro-particle reduction coatings of the instant invention are thick enough to protect the electron-emitting surfaces, but not too thick to peel or crack from thermal stress. However, the macro-particle reduction coatings may have a wide range of thicknesses and still achieve the beneficial effects described herein. Preferably, the coatings have a thickness in the range of 100-500 µm. However, the coatings may have a thickness that is between 1 and 100 µm.

The macro-particle reduction coatings of the instant invention may be applied to a portion of an electrode, i.e. the portion of the electrode that generates and interacts with plasma, such that the electrode is at least partially coated with the macro-particle reduction coating. The macro-particle reduction coatings of the instant invention may alternatively be applied to the entire electrode, such that the electrode is completely coated with the macro-particle reduction coating. The macro-particle reduction coating may also be applied to the plasma exit orifice of a hollow cathode electrode.

Figure 2:
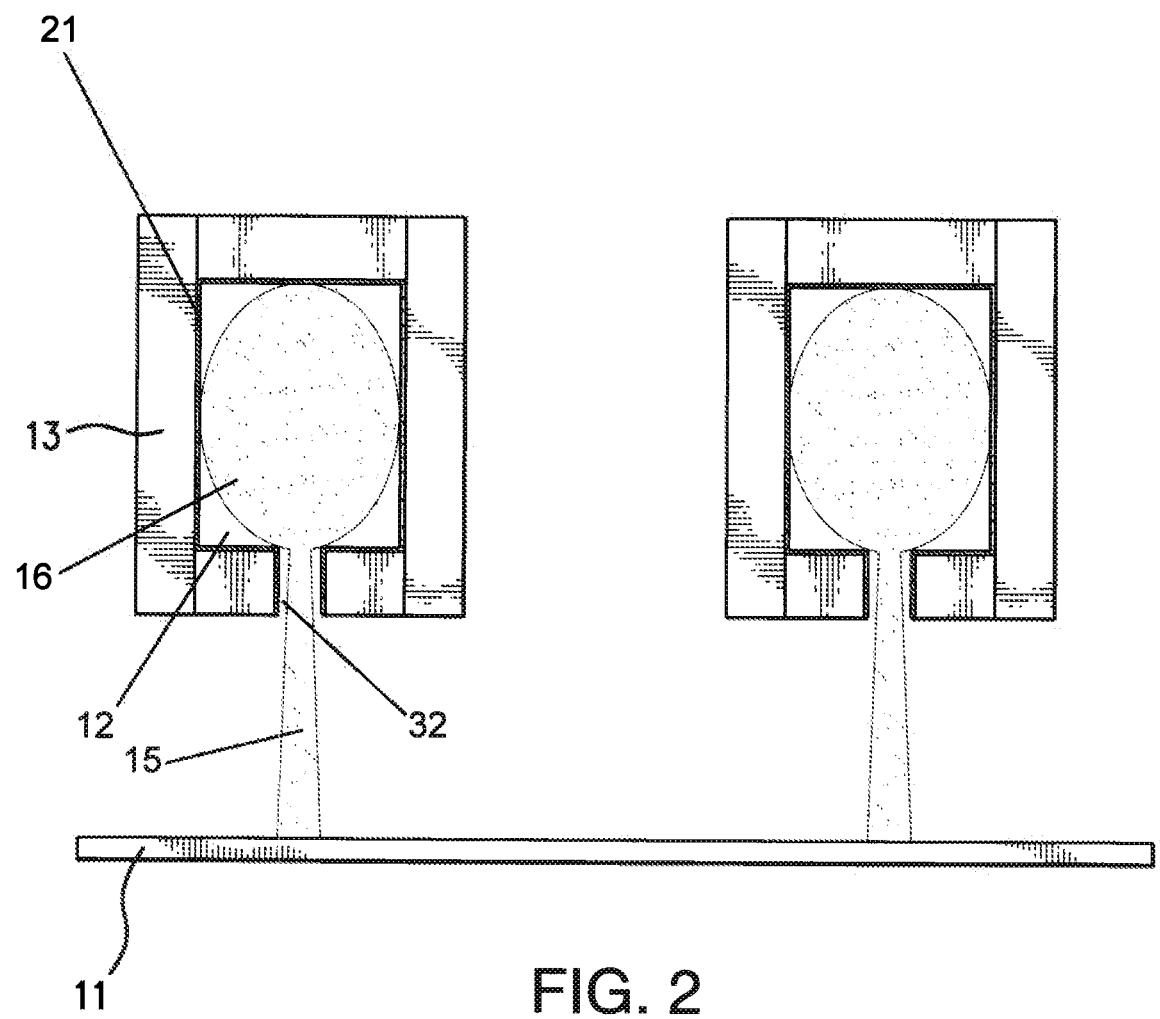
FIG. 2 shows two electrodes, positioned in a plasma source device, wherein the electrodes are coated with a macro-particle reduction coating, in accordance with some exemplary embodiments of the invention.

FIG. 2 shows two electrodes coated with macro-particle reduction coatings in accordance with various embodiments of the invention. The electrodes 13 may be positioned in a plasma source, and configured to produce a plasma. The first and second electrodes each substantially enclose an elongated gas-containing volume, i.e. a hollow cathode cavity. The hollow cathode electrodes may extend substantially parallel to one another, and be oriented perpendicular to the moving direction of the substrate 11 to be treated. In some less-common embodiments, the hollow cathodes may be oriented at an angle to the moving direction of the substrate. The first and second hollow cathode electrodes are essentially surrounded by insulating material (not shown). The first and second hollow cathode electrodes are both provided with a gas inlet for the plasma forming gas and with a plasma outlet 32 for the ionized plasma gas.

A coating 21 is applied to the entire interior cavity 12 of each of the two hollow cathode electrodes 13, to protect the electrodes 13 from sputtering caused by the plasma 16 produced within the cavity 12. The coating 21 is additionally applied to the plasma exit orifice 32 of each hollow cathode electrode 13. The coating 21 substantially prevents the formation of particulate debris which may fall onto the substrate 11 during deposition of a thin film coating. The coating 21 also helps to stabilize the operating voltage of the plasma device during long term operation.

The coated electrodes of the present invention may be incorporated into a wide range of devices, including plasma sources and ion sources. Several example embodiments of plasma sources incorporating electrodes coated with macro-particle reduction coatings in accordance with various aspects of the present invention are described below.

In one embodiment, a plasma source is provided, wherein the plasma source comprises at least two electrodes connected to each other via an AC power source. The AC power source supplies a varying or alternating bipolar voltage to the two electrodes. The two electrodes are each coated with a macro-particle reduction coating. The bipolar power supply initially drives a first electrode to a negative voltage, allowing plasma formation, while the second electrode is driven to a positive voltage in order to serve as an anode for the voltage application circuit. This then drives the first electrode to a positive voltage and reverses the roles of cathode and anode. As one of the electrodes is driven negative, a discharge forms within the corresponding cavity. The other cathode then forms an anode, causing electrons to escape the plasma and travel to the other side, thereby completing an electric circuit. Generally, under process conditions which are useful for coating or surface treatment, electrodes of the present invention are heavily water cooled. The plasma sources according to the invention require no additional electrodes, acceleration grids, magnetic fields, shunts, or neutralizers. They are therefore less complex and thus less costly than other plasma sources. However, when desired for particular reasons, magnets and/or additional electrodes may be used in conjunction with the arrangement of hollow cathodes according to the present invention.

Figure 3:
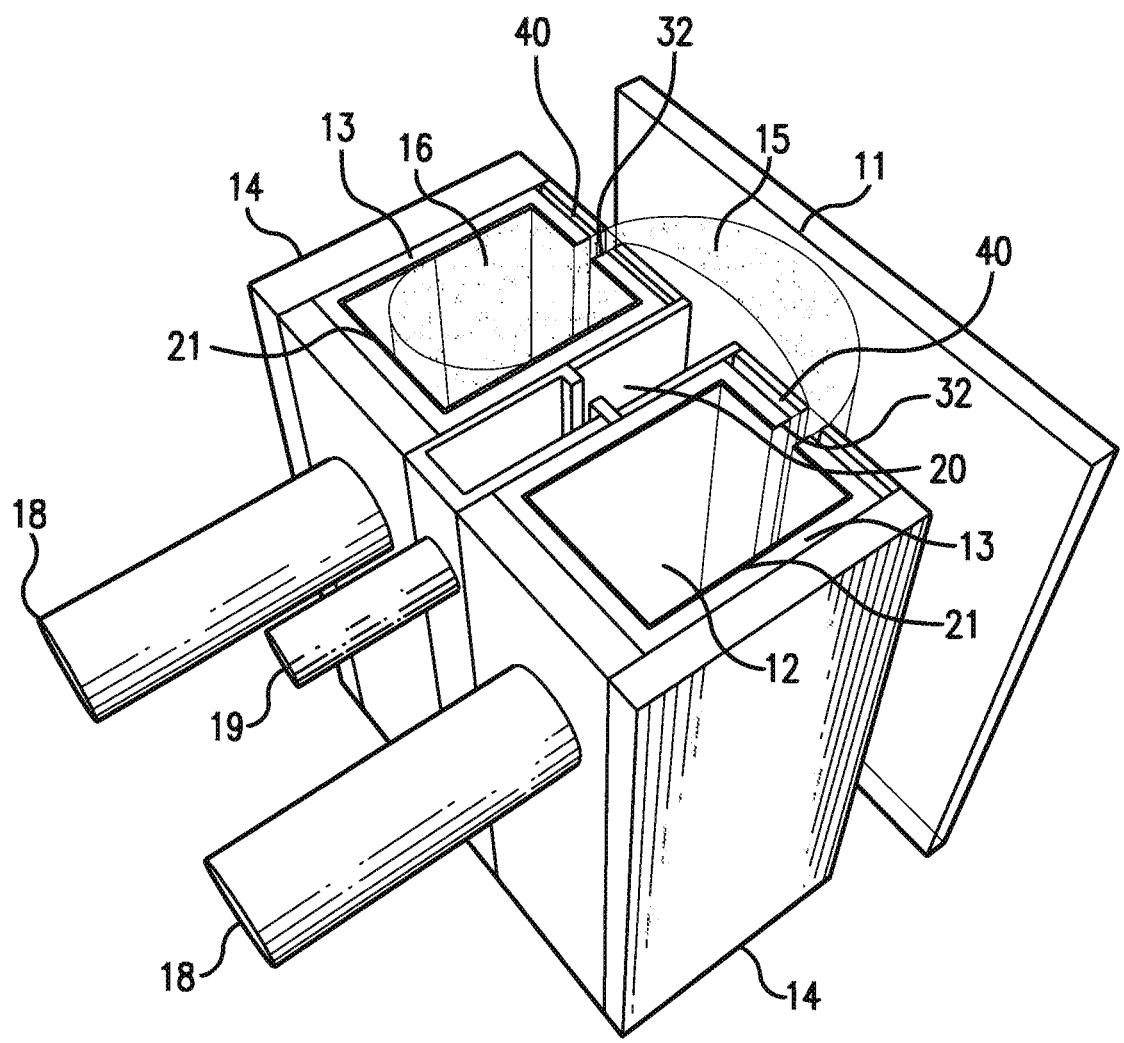
FIG. 3 shows a plasma source comprising a first electrode and a second electrode separated by a gas containing space, wherein a macro-particle reduction coating is deposited on at least a portion of each of the first electrode and the second electrode, in accordance with some exemplary embodiments.

FIG. 3 shows a dual hollow cathode plasma source in accordance with various aspects of the present invention. Hollow cathode 13 is disposed in close proximity and aligned substantially parallel to a second hollow cathode 13. Each hollow cathode 13 has a plasma exit orifice 32 that is configured to face the substrate 11. The hollow cathodes are configured so that the distance between the plasma nozzles is in the range of 50 to 400 mm. Electrically insulating material 14 is disposed around the hollow cathodes and restricts the formation of extraneous plasma emissions at external electrode surfaces.

Each of the hollow cathodes 13 are comprised of electron emitting materials, and the portion of each hollow cathode that generates and interacts with the plasma is coated with a macro-particle reduction coating 21. This coating may also be applied to the plasma exit orifices 32, if desired. During plasma source operation, the coatings 21 directly contact the plasma-forming gas, and are substantially resistant to chemical reaction with the plasma-forming gas. When the plasma source is run continuously for extended periods of time, the coatings 21 are substantially resistant to chemical reaction with the plasma-forming gas for at least 100 hours, or at least 300 hours of extended operation. Further, in embodiments, the coating is resistant to chemical reaction with the plasma-forming gas when the power input per meter of plasma length is greater than 20 kw, or greater than 40 kw. The coatings 21 thus protect the electrodes, which would otherwise react with the plasma gas, and extend their service life.

The two hollow cathodes are separated by a gas-containing space 20. The hollow cathodes are electrically connected to each other in a bipolar and out of phase manner via an AC power source (not shown), as described above. The areas of electron oscillation 16, which takes place within the cavity of the hollow cathodes are shown in FIG. 3. This hollow cathode plasma source is disposed with a precursor gas inlet tube and manifold 19 for delivery of precursor gases intended to be deposited by PECVD. In the embodiment of FIG. 3, the reactant gas manifolds 19 are made from non-electrically conductive material. However, these gas manifolds may be made from electrically conductive material if, as will be understood by those of skill in the art, proper insulation is provided between the manifold and the electrodes. Tubes 18 are also provided for delivery of reactant gases.

When a voltage difference is applied across the hollow cathodes 13, a plasma is created. The voltage supplied to the plasma source may be in a range from about 100 volts to about 2000 volts. A typical range is from about 300 volts to about 1200 volts; or, more specifically from 400 volts to 700 volts. The plasma sources of the instant invention may be used at extremely high power densities. In embodiments, the power density is greater than 20 kw, or greater than 40 kw of power input per meter of plasma length.

The polarities of the two electrodes in the hollow cathode plasma source are switched from positive to negative at some predetermined frequency, and the plasma becomes spread out and uniform. The space that exists between the plasma nozzles of the two electrodes is where the electric current flows. This space can be made to vary in distance depending on the coating parameters to be used. This distance may be between about 1 mm to about 0.5 meters and is determined, in part, by the design of the plasma forming apparatus and operating gas pressure surrounding the electrodes.

Different arrangements and shapes are possible for a plasma outlet and nozzle 32. Typically, they are an array of holes. They may also comprise a slot or elongated orifice. A gas pressure drop exists between the hollow cathode cavities and the exterior, i.e. the vacuum chamber. A sufficiently high pressure level for sustaining a stable plasma is maintained in the cathode cavity 12 and an outflow of the ionized gas from the cavity towards the exterior is achieved. The nozzles 32 thus distance the electrodes from the coating process atmosphere in the vacuum chamber and therefore reduce the probability of soiling from the injected coating precursor.

The plasma produced is a long (e.g., >0.5 meter), stable and uniform linear plasma, beneficial for PECVD processes, and is generated without relying on closed circuit electron drift (e.g. the Hall effect).

Hollow cathode cavities of opposite polarity must be electrically isolated from each other. Accordingly, in the PECVD device of FIG. 3, around each of the hollow cathodes 12, insulation 14 is provided. The insulation may comprise a solid dielectric insulation or a dark space. The width of dark space is dependent on pressure and may be from about 0.3 mm to about 3 mm in the pressure range of about 1 millibar to about $10^{-3}$ millibar.

For the coating or surface treatment of large area substrates, the hollow cathodes may be elongated to lengths of at least 2 to 3 meters. In FIG. 3, elongation would occur in the upward direction, or coming out of the plane of the paper.

Figure 4:
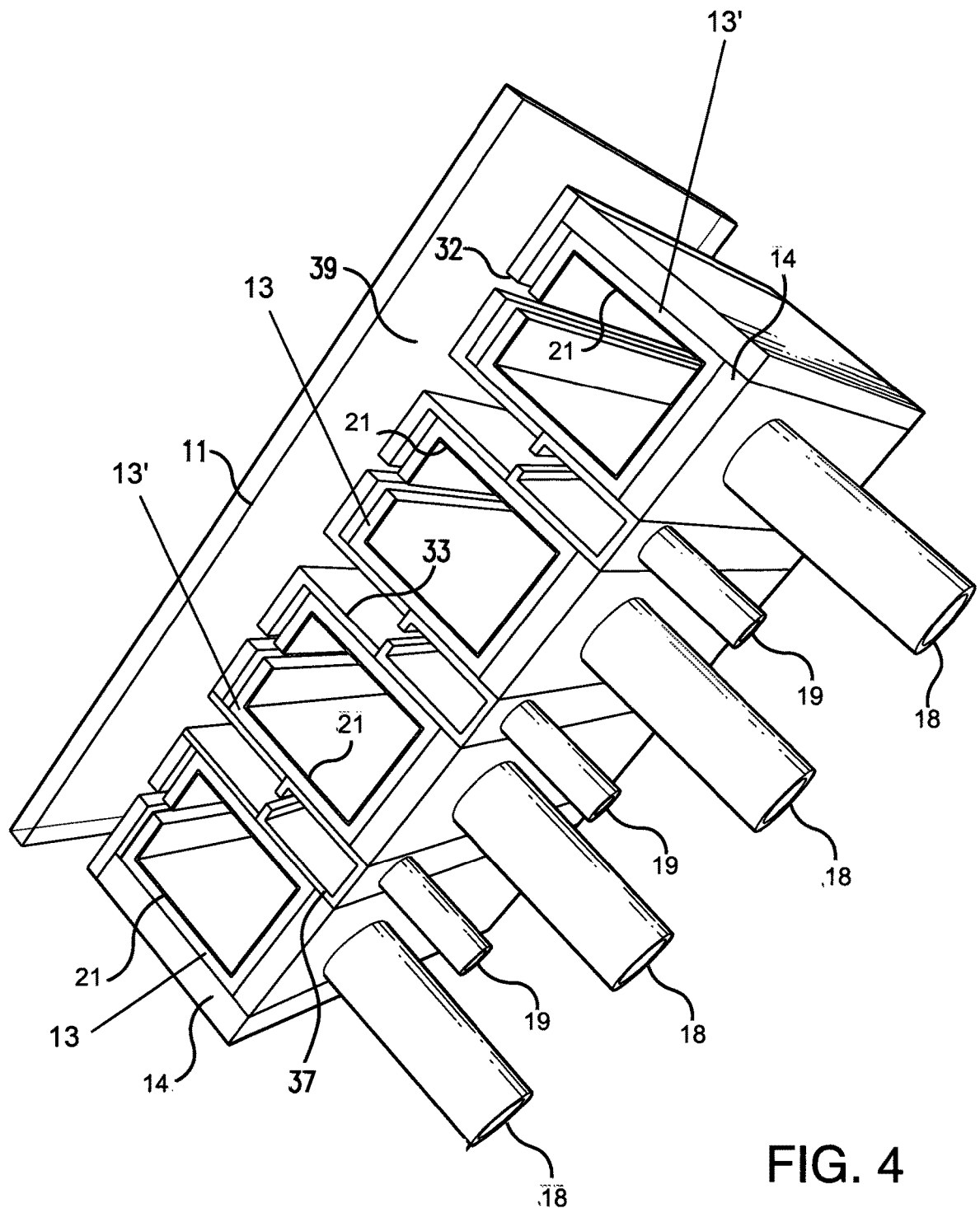
FIG. 4 shows a plasma source comprising a plurality of pairs of electrodes, wherein the electrodes are coated with a macro-particle reduction coating, according to some exemplary embodiments.

Shown in FIG. 4 is an embodiment of a hollow cathode plasma source according to various aspects of the present invention. FIG. 4 is similar to FIG. 3 in that both embodiments depict hollow cathodes disposed adjacently. In FIG. 4, however, the number of hollow cathodes has been increased from 2 to 4, to form an array of hollow cathodes disposed adjacently. The exact number of hollow cathodes is not particularly limited and may be adjusted as desired, as will be recognized by those of skill in the art in view of the disclosure herein. Typically, 4, 6, or 8 hollow cathodes may be used, but more than 8 may be used, if desired.

The regions of the hollow cathodes 13, 13' that generate and interact with the plasma are covered with a macro-particle reduction coating 21. In addition, the plasma exit orifices 32 of each hollow cathode may be coated with the macro-particle reduction coating 21. In the device of FIG. 4, the hollow cathodes 13, 13' are electrically connected with voltages alternating in phase. Hollow cathodes 13 may be out of phase with hollow cathodes 13', however alternative polarity configurations are possible. Thus, each hollow cathode of the array can have on either side a hollow cathode which is out of voltage phase. Each of the hollow cathodes is surrounded by insulation 14. The insulation may comprise a solid insulator or a dark space. The width of dark space is dependent on pressure and may be from about 0.3 mm to about 5 mm in the pressure range of about 1 millibar to about $10^{-3}$ millibar. The outer faces of the hollow cathodes at each end of the array and in the back of the array are also covered by insulating material to reduce plasma formation in the back or sides of the PECVD device of FIG. 4.

Reactant gas may be supplied directly into the region of electron oscillation through tubes 18. As a non-limiting example, if an oxynitride type layer is desired, the reactant gas manifold may be supplied with oxygen and nitrogen.

Precursor gas manifolds 19 may be supplied with different precursor gases so that a multilayer deposition is formed on substrate 11 as it moves past the plasma source of FIG. 4. Additional embodiments may include providing an inert plasma gas, and having the reactant gas and precursor gas supplied through the precursor manifolds, either as a gas mixture or from manifold pairs. As a non-limiting example, if a glass coating system of: glass/$SiO_2$/$TiO_2$/$SnO_2$ is desired, three consecutive precursor gas manifolds may be supplied with the appropriate precursor gases that comprise silicon, titanium and tin, respectively. In cases where very high deposition rate is desired for a single material, the same precursor gas may be injected into more than one precursor manifold 19. The deposition rate of at least about 0.2 µm/second that is achieved with this configuration may then be multiplied by the number of hollow cathode pairs. (e.g., one pair of hollow cathodes corresponds to a deposition rate of at least about 0.2 µm/second; two pair of hollow cathodes corresponds to a deposition rate of at least about 0.4 µm/second; three pair of hollow cathodes corresponds to a deposition rate of at least about 0.6 µm/second).

In the embodiment of FIG. 4, the precursor gas manifolds 19 are made from of a non-electrically conductive material. However, these gas manifolds may be made from electrically conductive material if, as will be understood by those of skill in the art, proper insulation is provided between the manifold and the electrodes.

For the coating or surface treatment of large area substrates, the hollow cathodes may be elongated to lengths of at least 2 to 3 meters. In FIG. 4, elongation would occur in the upward direction, or coming out of the plane of the paper.

The internal hollow cathode cavity size in a hollow cathode plasma source changes with pressure. As referred to herein, hollow cathode cavity size is the characteristic distance of the hollow cathode, a measure of the size of the region of electron oscillation. Typical internal cavity pressures may be from about 1 millibar to about $10^{-2}$ millibar. At an internal cavity pressure of about 0.5 millibar to about 1 millibar, the optimal distance may be about 2 mm to about 50 mm. A preferred distance is from about 10 mm to about 50 mm. At an operating gas pressure of about $10^{-2}$ millibar, the optimal distance may be from about 10 mm to about 100 mm. Larger distances may enable plasma formation in these lower pressure ranges, however size limitation begins to pose practical concerns for device manufacture. A preferred distance in this case is from about 50 mm to about 100 mm. The length of the plasma in accordance with the present invention can be made as long or as short as needed by varying the length of the electron emitting surfaces. Plasmas in accordance with the present invention can be made to be very long, i.e. greater than 0.5 meters.

The aforementioned advantages of the plasma sources in accordance with the present invention have direct impact in the field of large area coatings, such as large area glass coatings. Glass substrates are coated with thin films that include, but are not limited to: 1) dielectric thin films; 2) transparent conductive thin films; 3) semi-conducting thin films; and 4) solar control thin films. Regarding the aforementioned groups of coatings, properties such as crystallinity, tensile stress and porosity can be tailored by adjusting certain deposition parameters of the plasma sources in accordance with the present invention.

The different materials that can be deposited by the plasma devices and methods in accordance the present invention are not particularly limited to dielectric materials, transparent conductive materials and/or semiconducting materials. If desired, organic materials can be deposited with the plasma devices and methods in accordance with the present invention. For example, an organic monomer that is subjected to a plasma from the plasma devices described herein would be provided with sufficient energy to undergo polymerization.

The following embodiments of the present invention are not intended to be limiting in any way. Those of skill in the art will recognize and appreciate how to adapt the devices and methods described herein without departing from the spirit or scope of the present invention.

EXAMPLES

Example 1

Macro-Particle Reduction Coatings Reduce Macro-Particle Accumulation on a Substrate During Extended Plasma Source Operation The inventors sought to determine the ability of the macro-particle reduction coatings of the instant invention to reduce macro-particle formation on a substrate during extended plasma source operation. A first test was performed using a hollow cathode plasma source comprising two uncoated stainless steel electrodes ("2 kw Plain SS"). These electrodes were arranged substantially parallel to one another, and the distance between the centers of each hollow cathode cavity was 116 mm. The plasma length was 100 mm, measured along the length of each electrode, i.e. between the centers of the furthest plasma nozzles of each electrode. The plasma source was positioned over a ceramic substrate and used to generate a plasma for a run time of approximately 160 hours. This test was repeated with a separate uncoated stainless steel electrode under the same conditions ("2 kW Plain SS #2").

A second test was performed using a hollow cathode plasma source in which a macro-particle reduction coating comprising tungsten carbide (WC) and a 12% cobalt binder was spray-coated onto plasma generating surfaces of two stainless steel hollow cathode electrodes ("2 kW WC coated"). The coating was applied with a plasma spray process to a thickness of approximately 100 µm. These electrodes were arranged substantially parallel to one another, and the distance between the center of each electrode cavity was 116 mm. This plasma source was positioned over a ceramic substrate and used to generate a plasma for a run time lasting about 140 hours.

Figure 5:
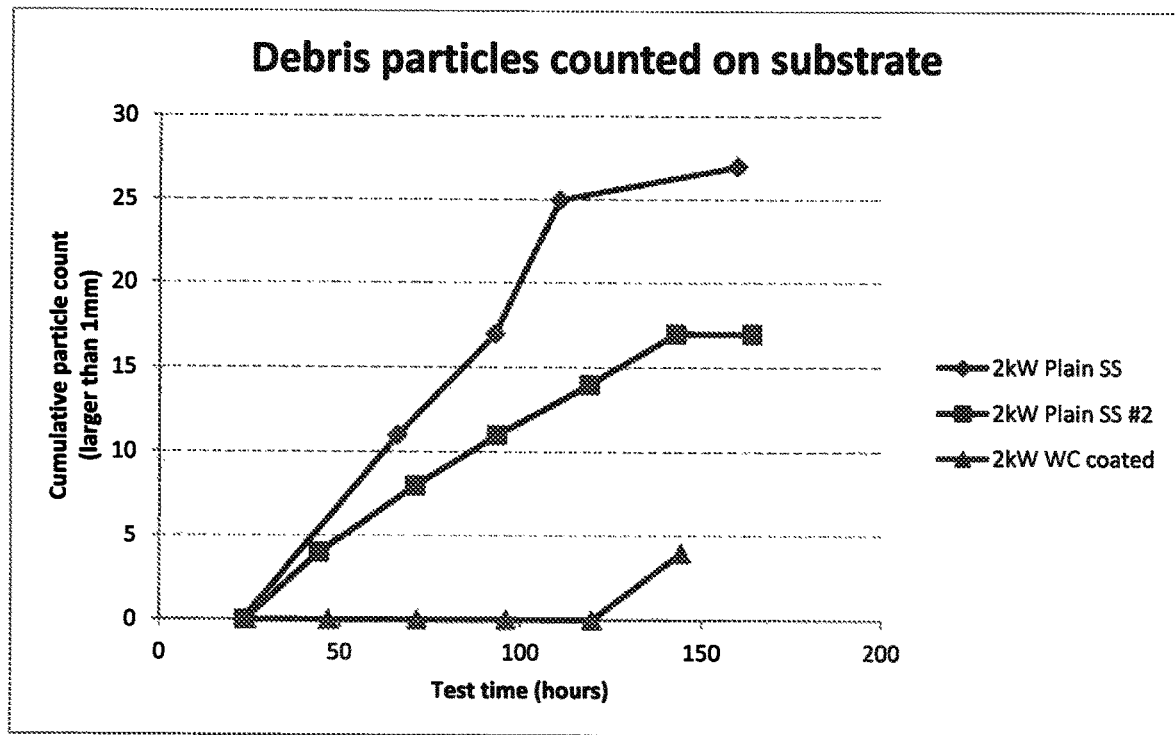
FIG. 5 is a graph showing debris formation on a substrate when the substrate is positioned under a either a plasma source comprising uncoated electrodes or a plasma source comprising electrodes coated with macro-particle reduction coatings according to some embodiments of the invention.

During the tests using the uncoated stainless steel electrodes (2 kW Plain SS and 2 kW Plain SS #2), macro particles accumulated on the substrate positioned below the electrodes. During the test using the plasma source incorporating electrodes coated with a macro-particle reduction coating (2 kW WC coated), a significantly reduced number of macro particles accumulated on the substrate. These data are displayed in FIG. 5.

The particles that accumulated during each test were irregularly shaped. Thus, the particles were measured across their longest dimension. In the tests using uncoated stainless steel electrodes (2 kW Plain SS and 2 kW Plain SS #2), macro particles having a length larger than 1 mm began to accumulate after 20 hours of plasma run time. Macro particles continued to accumulate throughout the duration of the run. In the tests using coated stainless steel electrodes (2 kW WC coated), the appearance on the substrate of macro particles having a length larger than 1 mm was not recorded until approximately 120 hours of plasma run time. Although macro particles continued to appear for the duration of the run, the cumulative particle count at the end of the run was significantly reduced when using coated electrodes compared to the cumulative particle count at the same time point in either of the tests using uncoated stainless steel electrodes. Accordingly, the data presented in FIG. 5 demonstrate that providing a macro particle reduction coating on plasma-generating electrodes is effective for reducing particulate matter and debris formation on a substrate positioned under the electrodes during extended plasma source operation. Further, the coating itself was not removed by the plasma during this test run. The coatings thus effectively protected the stainless steel electrodes of the coated source, reduced the formation of macro-particles, and extended the service life of the electrodes.

Example 2

Macro-Particle Reduction Coatings Reduce the Formation of Macro-Particles in the Interior Cavity of Hollow Cathode Electrodes During Extended Plasma Source Operation The inventors sought to determine the ability of the macro-particle reduction coatings of the instant invention to reduce macro-particle formation in the interior cavity of hollow cathode electrodes during extended plasma source operation.

Figure 6:
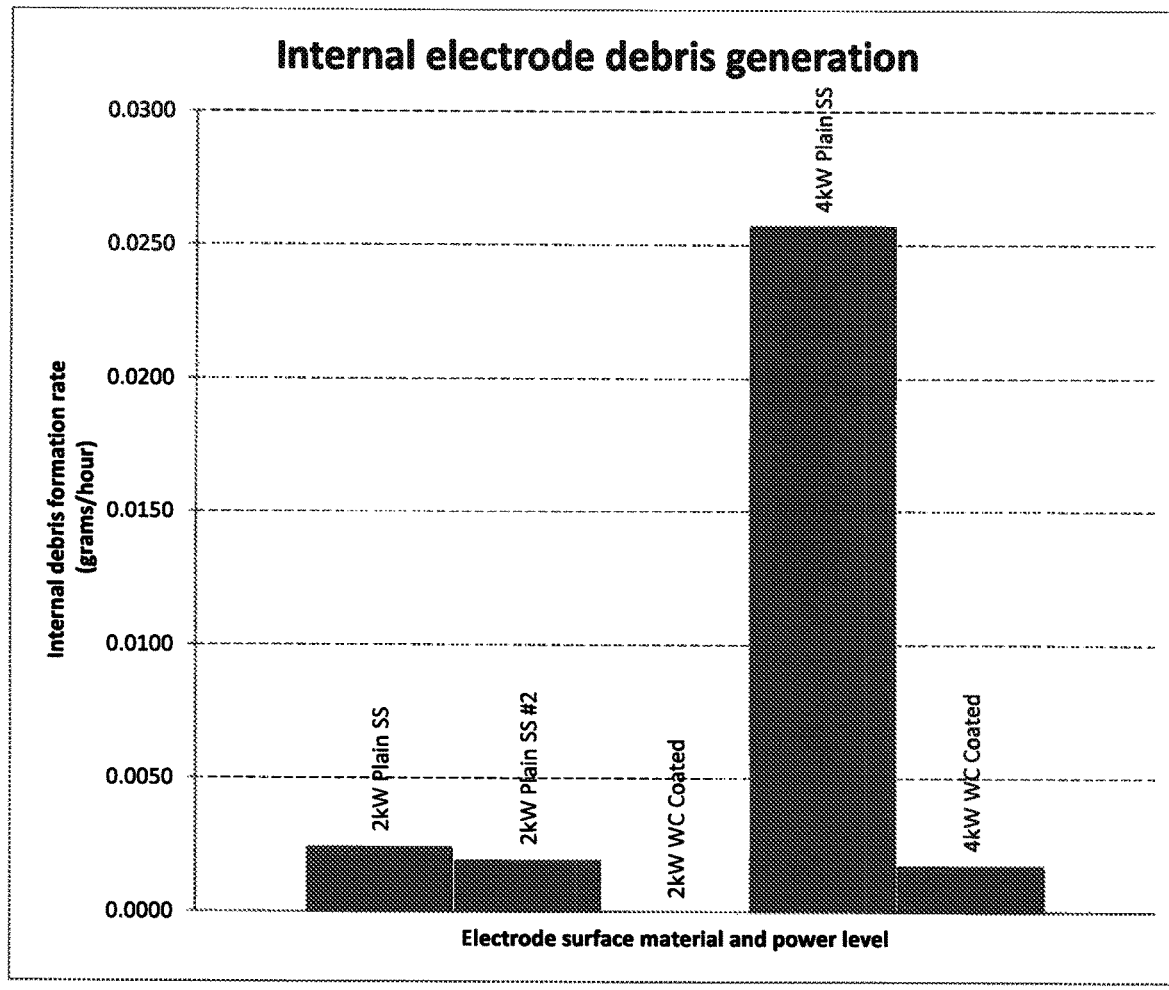
FIG. 6 is a graph comparing debris formation in the interior cavity of an uncoated hollow cathode and debris formation in a hollow cathode coated with macro-particle reduction coating during extended operation of a plasma source, according to some embodiments of the invention.

FIG. 6 shows the results of an experiment wherein hollow cathode electrodes were provided and configured in a plasma source. The internal cavity of the hollow cathodes, where plasma formation occurs, was either uncoated (Plain SS), or was coated with a tungsten carbide coating (WC Coated). The coating was approximately 100 µm thick, and comprised a 12% cobalt binder. The plasma sources were used to generate a plasma for a predetermined period of time greater than 100 hours. Specifically, the predetermined period of time was between 100-200 hours. After completion of this run time, the hollow cathodes were removed and the loose internal debris that had accumulated in their interior cavities was weighed. The average rates of internal debris formation (grams/hour) were calculated, and are indicated in FIG. 6. When the power provided to the electrodes was 2 kW, debris formed in the interior cavity of the uncoated electrodes. However, debris formation was almost undetectable when the coated electrodes were used to generate plasma when the power provided to the electrodes was 2 kW. When the power provided to the electrodes was increased to 4 kW, the debris formation rate increased significantly in the uncoated electrodes. The rate of debris formation in coated electrodes was significantly reduced compared to the uncoated hollow cathodes at 4 kw of power.

Accordingly, the data presented in FIG. 6 demonstrate that providing a macro particle reduction coating on plasma-generating electrodes is effective for reducing particulate matter and debris formation on the electrode surfaces themselves, for example in the internal cavity of a hollow cathode, during extended plasma source operation.

Example 3

Macro-Particle Reduction Coatings Stabilize Voltage Output During Extended Plasma Source Operation The inventors sought to determine the ability of the macro-particle reduction coatings of the instant invention to reduce voltage drift of a plasma source during extended operation.

Output voltage was compared between a hollow cathode plasma source incorporating uncoated stainless steel electrodes and a similar hollow cathode plasma source incorporating electrodes coated with a macro-particle reduction coating, during extended operation of the plasma sources.

Figure 7A:
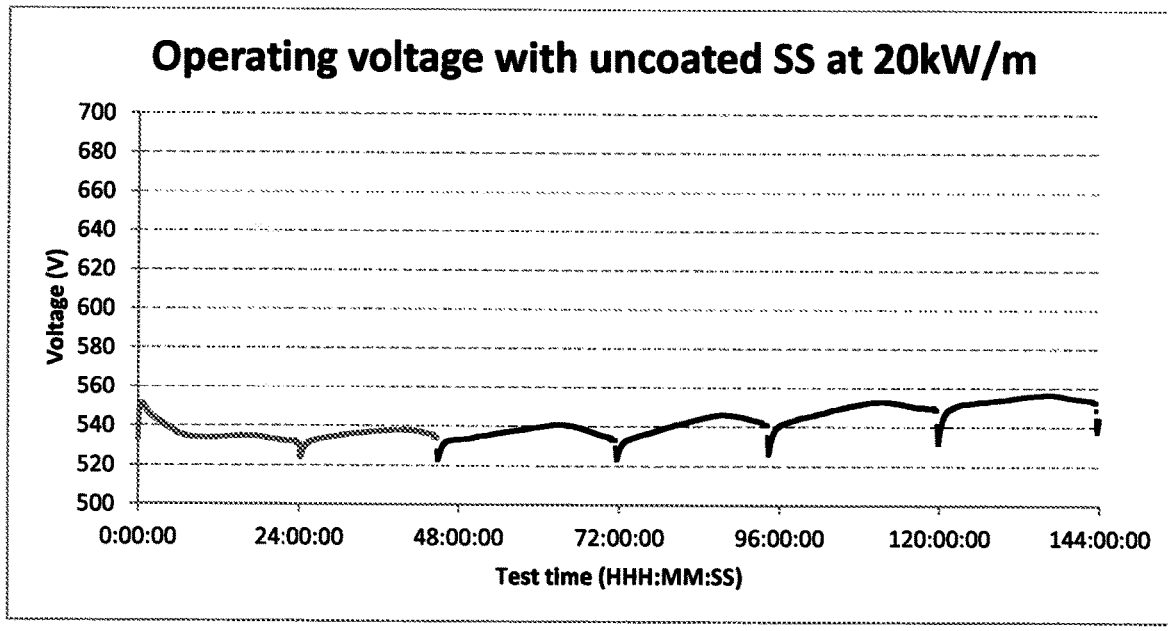
FIGS. 7A, 7B, 7C and 7D are graphs showing voltage output during extended operation of a plasma source comprising uncoated stainless steel electrodes compared to a plasma source comprising electrodes coated with macro-particle reduction coatings according to some embodiments of the invention.
Figure 7B:
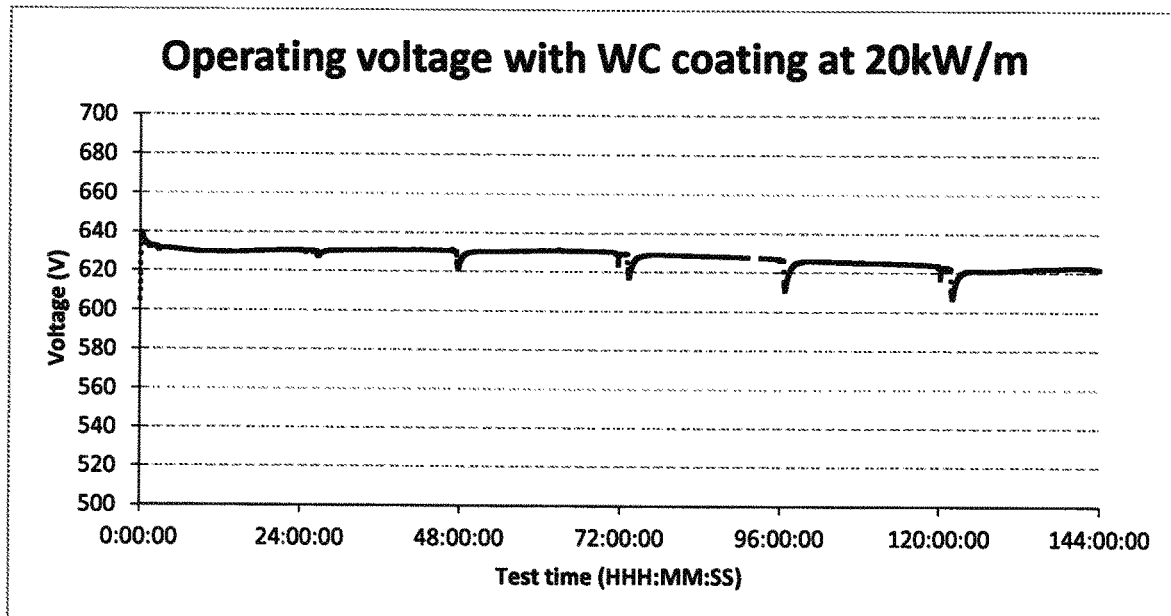
Figure 7C:
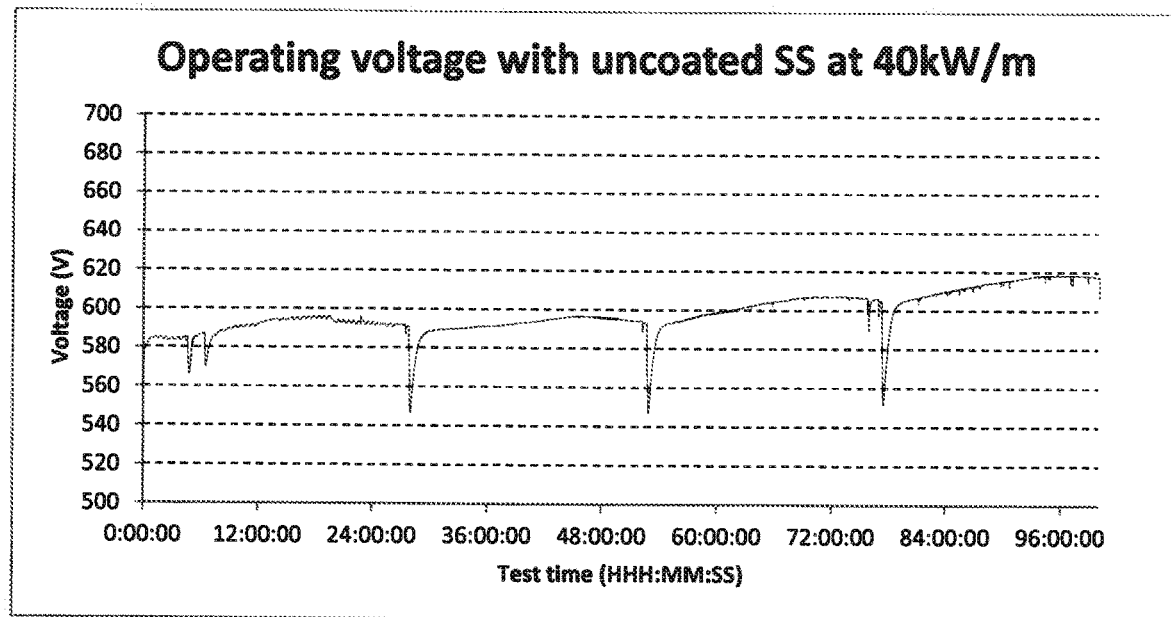

In the first test, a hollow cathode plasma source comprising two uncoated stainless steel electrodes were used to generate a plasma for a test run lasting at least 144 hours, at a power density of 20 kW/m. As shown in FIG. 7A, the operating voltage increased by approximately 20 volts over the course of the test run. When the power was increased to 40 kw/m in a similar test, the voltage increased by approximately 40 volts over the course of the test run, as shown in FIG. 7C. Short duration voltage dips shown on the graphs are due to pressure change during the removal and re-insertion of substrates.

Figure 7D:
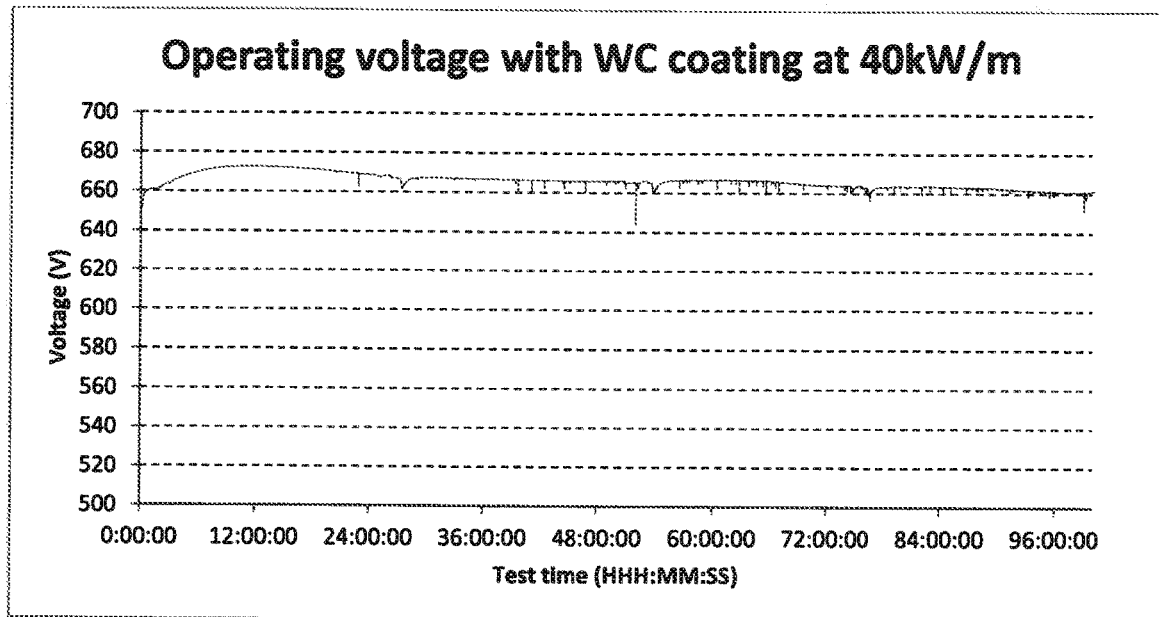

In a second test, a hollow cathode plasma source incorporating stainless-steel electron-emitting surfaces coated with an approximately 100 μm thick coating was positioned over a substrate and used to generate a plasma for a test run lasting at least 144 hours at a power density of 20 kW/m. The coating comprised tungsten carbide (WC) with a 12% cobalt binder. As shown in FIG. 7B, the operating voltage remained more stable compared to the run using uncoated electrodes. During this test using coated electrodes, the voltage drifted downward less than 10 volts over the course of the run. When the power was increased to 40 kw/m in a similar test, the voltage was roughly constant over the course of the test run as shown in FIG. 7D. As above, short duration voltage dips shown on the graphs are due to pressure change during the removal and re-insertion of substrates.

It can be seen by comparing the voltage output from the coated electrodes of FIG. 7B (or FIG. 7D) and the uncoated stainless steel electrodes of FIG. 7A (or FIG. 7C) that the coated electrodes produced a more stable output voltage over extended operation of the plasma source compared to the uncoated electrodes. More specifically, the coatings prevented voltage drift during extended operation of the plasma sources.

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A plasma source comprising:
    a first electrode and a second electrode separated by a gas containing space, wherein a macro-particle reduction coating is deposited on at least a portion of each of the first electrode and the second electrode;
    a power source to which the first and second electrodes are electrically connected configured to supply a voltage that alternates between positive and negative to cause the voltage supplied to the first electrode to be out of phase with the voltage supplied to the second electrode and creating a current that flows between the electrodes;
    wherein the current creates a plasma between the electrodes that is substantially uniform over its length;
    wherein the first and second electrodes are shielded from contact with the plasma by the coating; and
    wherein the coating is resistant to forming particulate matter,
    wherein the coating comprises carbon and a transition metal, and
    wherein the coating further comprises a binder, said binder comprising a metal or metal alloy.

2. The plasma source of claim 1, wherein plasma is substantially uniform in its length in the substantial absence of closed circuit electron drift.

3. The plasma source of claim 1, wherein the plasma source is configured to deposit a coating using plasma enhanced chemical vapor deposition (PECVD).

4. The plasma source of claim 1, wherein the plasma source is provided with a power input greater than 20 kW per linear meter of plasma length.

5. The plasma source of claim 4, wherein the plasma source is provided with a power input greater than 40 kW per linear meter of plasma length.

6. The plasma source of claim 1, wherein the first electrode and the second electrode produce reduced particulate matter compared to uncoated electrodes.

7. The plasma source of claim 1, wherein the coating comprises a material having a low rate of sputtering.

8. The plasma source of claim 1, wherein the coating is substantially resistant to chemical reaction with the plasma.

9. The plasma source of claim 1, wherein the coating material has a resistivity less than 105 ohm cm.

10. The plasma source of claim 9, wherein the coating material has a resistivity less than 103 ohm cm.

11. The plasma source of claim 1, wherein the plasma comprises argon gas, and the rate of sputtering is less than 0.5 atoms per ion at 500 eV ion energies.

12. The plasma source of claim 11, wherein the rate of sputtering is less than 0.2 atoms per ion at 500 eV ion energies.

13. The plasma source of claim 1, wherein the coating comprises tungsten carbide.

14. The plasma source of claim 1, wherein the coating comprises chromium carbide.

15. The plasma source of claim 1, wherein the coating comprises bor on carbide.

16. The plasma source of claim 1, wherein the coating comprises silicon carbide.

17. The plasma source of claim 1, wherein the coating comprises aluminum carbide.

18. The plasma source of claim 1, wherein the coating comprises indium oxide doped with tin.

19. The plasma source of claim 1, wherein the coating comprises a material selected from the group consisting of tungsten, chromium, titanium, molybdenum, and zirconium.

20. The plasma source of claim 1, wherein the coating comprises a metal alloy.

21. The plasma source of claim 1, wherein the coating comprises greater than 50 weight percent of one or more materials selected from the group consisting of cobalt, molybdenum, nickel, chromium, and alloys thereof.

22. The plasma source of claim 21, wherein the coating additionally comprises less than or equal to 49 weight percent of aluminum or silicon.

23. The plasma source of claim 21, wherein the coating contains ionic or covalent bonding.

24. The plasma source of claim 1, wherein the coating comprises a metal alloy selected from the group consisting of aluminum, silicon, nickel, chromium, and nickel-chromium.

25. The plasma source of claim 1, wherein the coating comprises a conductive ceramic material.

26. The plasma source of claim 1, wherein the coating has a sputter yield of less than 1 atom per ion when exposed to argon ions with energies of about 500 eV.

27. The plasma source of claim 26, wherein the coating has a sputter yield of less than 0.5 atoms per ion when exposed to argon ions with energies of about 500 eV.

28. The plasma source of claim 1, wherein the coating has a bond energy of greater than 12 ev per molecule.

29. The plasma source of claim 1, wherein the coating comprises a carbide selected from the group consisting of titanium carbide, zirconium carbide, hafnium carbide, chromium carbide, and tantalum carbide.

30. The plasma source of claim 1, wherein the first electrode and the second electrode form a first pair of electrodes, and the plasma source further comprises at least a third electrode and a fourth electrode forming a second pair of electrodes; wherein the first pair and the second pair of electrodes are disposed adjacently in an array.

31. The plasma source of claim 30, wherein the first electrode and the second electrode are each configured to produce a hollow cathode discharge.

32. The plasma source of claim 30, wherein the first, second, third, and fourth electrodes are each configured to produce a hollow cathode discharge.

33. The plasma source of claim 1,
wherein the coating comprises a material having a resistivity less than 107 ohm cm.

34. The plasma source of claim 33, wherein the thickness of the coating is between 100 and 500 μm.

35. The plasma source of claim 33, wherein the thickness of the coating is between 1 and 100 μm.

36. The plasma source of claim 33, wherein the coating is resistant to sputtering by the plasma.

37. The plasma source of claim 33, wherein the coating is deposited on at least a portion of the first plasma-generating surface of the electrode by a thermal spray coating process.

38. The plasma source of claim 37, wherein the spray coating process used to deposit the coating comprises one of plasma thermal spray coating, plasma cold spray coating, flame spraying, wire arc spraying, detonation spraying, and high velocity oxygen fuel (HVOF) thermal spray coating.

39. The plasma source of claim 33, wherein the electrode comprises a material selected from the group consisting of steel, stainless steel, aluminum, and copper.

40. The plasma source of claim 33, wherein the voltage is between 400 V and 700 V.

41. The plasma source of claim 33, wherein the coating on the electrode prevents voltage drift during extended operation of the plasma source.

42. The plasma source of claim 33, wherein the coating contacts a plasma-forming gas, and wherein the coating is substantially resistant to chemical reaction with the plasma-forming gas.

43. The plasma source of claim 42, wherein the coating is substantially resistant to chemical reaction with the plasma-forming gas for at least 100 hours of continuous plasma source operation.

44. The plasma source of claim 42, wherein the coating is substantially resistant to chemical reaction with the plasma-forming gas for at least 300 hours of continuous plasma source operation.

45. The plasma source of claim 42, wherein the coating has a bond energy greater than 12 ev per molecule.

46. The plasma source of claim 42, wherein the coating is selected from the group consisting of titanium carbide, zirconium carbide, hafnium carbide, chromium carbide, and tantalum carbide.

47. The plasma source of claim 42, wherein the coating is resistant to chemical reaction with the plasma-forming gas during extended plasma source operation when the power input per meter of plasma length is greater than 20 kw.

48. The plasma source of claim 42, wherein the coating is resistant to chemical reaction with the plasma-forming gas during extended plasma source operation when the power input per meter of plasma length is greater than 40 kw.

49. The plasma source of claim 1, wherein the binder comprises at least one of cobalt, nickel, and chromium.

50. The plasma source of claim 1, wherein the binder comprises about 5-30 weight percent of the coating.

\* \* \* \* \*